US009557585B1

(12) United States Patent
Yap et al.

(10) Patent No.: US 9,557,585 B1
(45) Date of Patent: Jan. 31, 2017

(54) STACKED ROWS PSEUDO-RANDOMLY SPACED TWO-DIMENSIONAL PHASED ARRAY ASSEMBLY

(71) Applicant: HRL LABORATORIES LLC, Malibu, CA (US)

(72) Inventors: Daniel Yap, Newbury Park, CA (US); Kevin Geary, Los Angeles, CA (US); Carson R. White, Agoura Hills, CA (US)

(73) Assignee: HRL Laboratories, LLC, Malibu, CA (US)

( * ) Notice: Subject to any disclaimer, the term of this patent is extended or adjusted under 35 U.S.C. 154(b) by 65 days.

(21) Appl. No.: 14/290,983

(22) Filed: May 30, 2014

Related U.S. Application Data

(60) Provisional application No. 61/829,194, filed on May 30, 2013.

(51) Int. Cl.
| G02F 1/25 | (2006.01) |
| G02B 3/06 | (2006.01) |
| G01S 7/495 | (2006.01) |
| G02F 1/025 | (2006.01) |
| G01S 7/481 | (2006.01) |
| G02B 3/00 | (2006.01) |
| H01L 25/16 | (2006.01) |
| G02F 1/015 | (2006.01) |

(52) U.S. Cl.
CPC ............. *G02F 1/025* (2013.01); *G01S 7/4813* (2013.01); *G01S 7/495* (2013.01); *G02B 3/0006* (2013.01); *H01L 25/167* (2013.01); *G02F 2001/0151* (2013.01)

(58) Field of Classification Search
CPC ........ G02B 3/006; G01S 7/4813; G01S 7/495; G02F 2001/0151; H01L 25/167
USPC .................................. 385/14; 342/359, 361
See application file for complete search history.

(56) References Cited

U.S. PATENT DOCUMENTS

| 5,138,626 | A | 8/1992 | Yap |
| 5,796,881 | A | 8/1998 | Manasson et al. |
| 5,943,159 | A | 8/1999 | Zhu |
| 6,195,373 | B1 | 2/2001 | Fukunaga |
| 6,393,185 | B1 | 5/2002 | Deacon |
| 6,400,008 | B1 | 6/2002 | Farnworth |
| 8,344,503 | B2 * | 1/2013 | Sanders .............. H01L 21/6835 257/723 |
| 8,451,872 | B2 | 5/2013 | Arimoto et al. |
| 2007/0058388 | A1 * | 3/2007 | Takatori ................. G02B 6/001 362/554 |
| 2009/0103875 | A1 | 4/2009 | Shimizu et al. |
| 2009/0302435 | A1 | 12/2009 | Pagaila et al. |

(Continued)

OTHER PUBLICATIONS

From U.S. Appl. No. 14/290,979 (Unpublished, Non Publication Requested), Restriction/Election mailed on Sep. 16, 2015.

(Continued)

*Primary Examiner* — Akm Enayet Ullah
(74) *Attorney, Agent, or Firm* — Ladas & Parry

(57) ABSTRACT

A phased array that comprises a predetermined number of emitter/receiver elements; said emitter/receiver elements being arranged on a array formed of stacked rows, wherein the emitter/receiver elements in each row of the array are distributed according to a pseudo-random pattern; and the heights of the rows vary according to a pseudo-random pattern.

19 Claims, 23 Drawing Sheets

(56) References Cited

U.S. PATENT DOCUMENTS

| | | | |
|---|---|---|---|
| 2010/0127345 A1 | 5/2010 | Sanders et al. |
| 2011/0291268 A1 | 12/2011 | Wang et al. |
| 2012/0201499 A1 | 8/2012 | Buijs et al. |
| 2012/0257860 A1 | 10/2012 | Li et al. |
| 2014/0159120 A1 | 6/2014 | Ahmed |

OTHER PUBLICATIONS

From U.S. Appl. No. 14/290,979 (Unpublished, Non-Publication Requested), Non-Final Rejection mailed on Feb. 17, 2016.

U.S. Appl. No. 14/290,986, filed May 30, 2014, Yap et al.

U.S. Appl. No. 14/290,979, filed May 29, 2014, Yap et al.

U.S. Appl. No. 61/829,194, filed May 30, 2013, Yap et al.

A. Hosseini, D. Kwong, Y. Zhao, Y.-S. Chen, F. Crnogorac, RF.W. Pease, and R T. Chen, "Unequally spaced waveguide arrays for silicon nanomembrane-based efficient large angle optical beam steering," IEEE J. Selected Topics in Quantum Electronics, vol. 15, No. 5, pp. 1439-1446, 2009.

A. W. Topol, et al., "Enabling technologies for wafer-level bonding of 3D MEMS and integrated circuit structures," Proceedings 54th Electronic Components and Technology Conference, pp. 931-398, 2004.

B. D. Steinberg, Principles of Aperture and Array System Design, Wiley-Interscience, New York, 1976.

C. A. Balanis, Antenna Theory: Analysis and Design, 2nd edition, Wiley, New York, Sections 3.6, 6.10, 12.2, and 12.3, 1997.

D. Kwong, A. Hosseini, Y. Zhang, and R.T. Chen, "1×12 Unequally spaced waveguide array for actively tuned optical phased array on a silicon nanomembrane," Applied Physics Letters, vol. 99, 051104, 2011.

D. Kwong, Y. Zhang, A. Hosseini and RT. Chen, "Integrated optical phased array based large angle beam steering system fabricated on silicon-on-insulator," Proceedings SPIE vol. 7943, p. 79430Y, 2011.

F. Vasey, F. K. Reinhart, R Houdre, and J. M. Stauffer, "Spatial optical beam steering with an AlCaAs integrated phased array," Appl. Opt. 32, pp. 3220-3232, 1993.

J. A. Burns, et al., "A wafer-scale 3-D circuit integration technology," IEEE Trans. Electron Devices, vol. 53, pp. 2507-2516, 2006.

J. A. McCaulley, V. M. Donnelly, M. Vernon and I. Taha, "Temperature dependence of the near-infrared refractive index of silicon, gallium arsenide, and indium phosphide," Physical Review B, vol. 49, pp. 7408-7417,1994.

J. E. Peters, P. D. Ownby, C. R Poznich, J. C. Richter and D. W. Thomas, "Infrared absorption of Czochralski germanium and silicon," Proceedings SPIE vol. 4452, pp. 17-24,2001.

J. H. Abeles and R J. Deri, "Suppression of sidelobes in the far-field radiation patterns of optical waveguide arrays," Applied Physics Letters, vol. 53, pp. 1375-1377, 1988.

J. J. McMahon, E. Chan, S. H. Lee, R. J. Gutmann and J.-Q. Lu, "Bonding interfaces in wafer-level metal/adhesive bonded 3D integration," Proc. 2008 Electronic Components and Technology Conference, pp. 871-878, 2008.

L. Schulwitz and A. Mortazawi, "A Tray Based Rotman Lens Array with Beamforming in Two Dimensions for Millimter-Wave Radar," IEEE Intl. Symposium on Phased Array Systems and Technology (ARRAY), pp. 850-853, Oct. 2010.

M. Jarrahi, R F. W. Pease, D. A. B. Miller and T. H. Lee, "High-speed optical beam-steering based on phased-array waveguides," J. Vacuum Science and Technology B, vol. 26, p. 2124-2126, 2008.

P. Enquist, "Scalable direct bond technology and applications driving adoption," 2011 IEEE Intl. 3D System Integration Conference (3DIC), p. P-1-6, 2012.

P. Enquist, et al., "Low cost of ownership scalable copper direct bond interconnect 3D IC technology for three dimensional integrated circuit applications," 2009 IEEE Intl. Conf. on 3D System Integration, 2009.

P.F. McManamon, T.A. Dorschner, D.C. Corkum, L.J. Friedman, D.S. Hobbs, M.K.O. Holz, S. Liberman, H. Nguyen, D.P. Resler, RC. Sharp, and E.A. Watson, "Optical phased array technology," Proceedings of IEEE, vol. 84, No. 2, pp. 268-298, 1996.

R J. Mailloux, Phased Array Antenna Handbook. Artech House, Boston, 1994, pp. 468-471.

T.E. Dillon, C.A. Schuetz, RD. Martin, D.C. Mackrides, P.F. Curt, J. Bonnet, and D.W. Prather, "Nonmechanical Beam Steering Using Optical Phased Arrays," Proc. of SPIE, vol. 8184, 81840F, pp. 1-11, 2011.

W. Peng, et al., "Single-crystal silicon/silicon dioxide multilayer heterostructures based on nanomembrane transfer", Applied Physics Letters, vol. 90, pp. 183107-1-183107-3.

From U.S. Appl. No. 14/290,986, Application and Office Actions.

From U.S. Appl. No. 14/290,979, Application and Office Actions.

From U.S. Appl. No. 61/829,194, Application.

From U.S. Appl. No. 14/290,986 (Unpublished, Non-Publication Requested), Non-Final Rejection mailed on Mar. 23, 2016.

From U.S. Appl. No. 14/290,986 (unpublished, non-publication requested), Final Rejection mailed on Sep. 13, 2016.

From U.S. Appl. No. 14/290,979 (unpublished, non-publication requested), Final Rejection mailed on Sep. 9, 2016.

\* cited by examiner

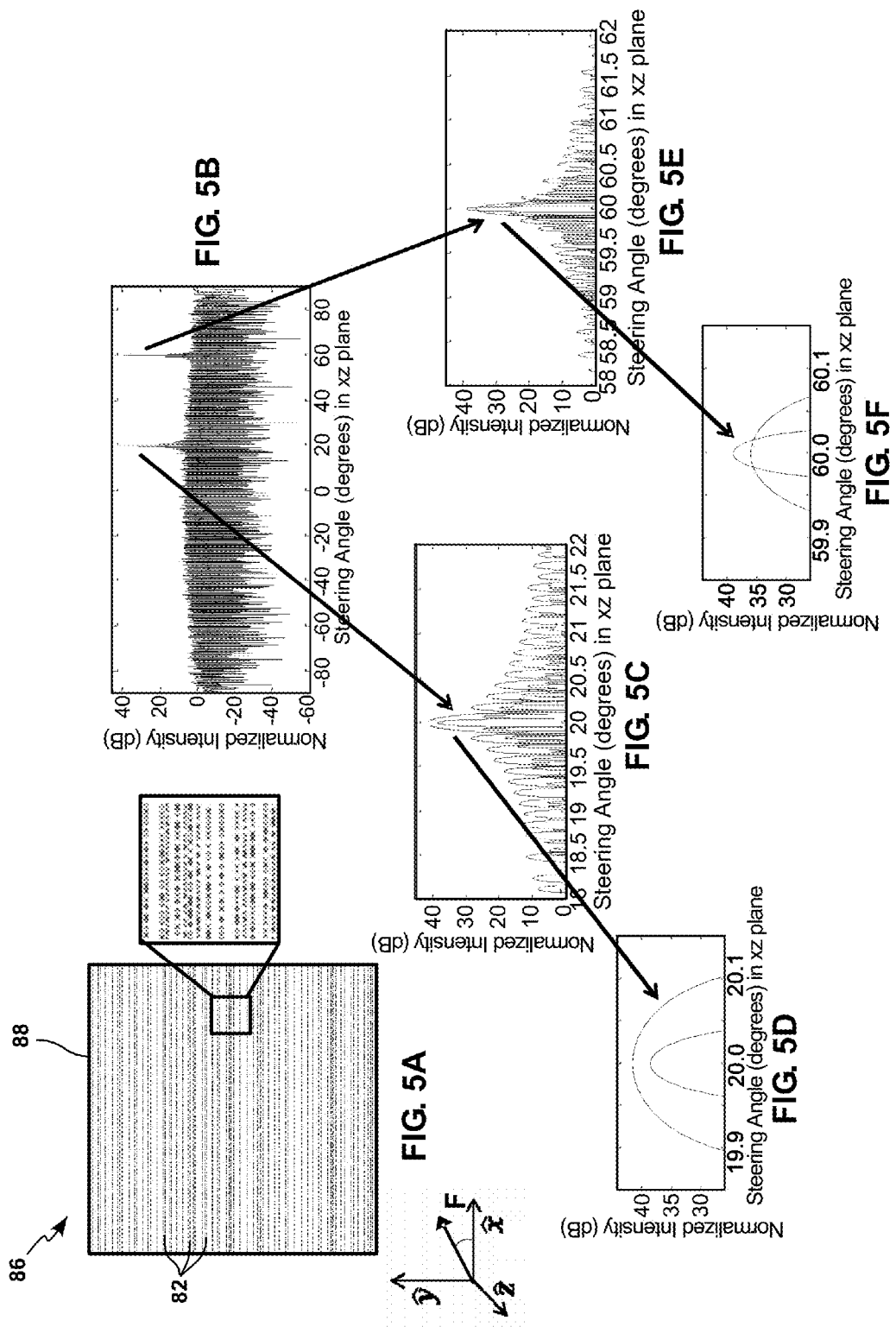

3mm x 3mm aperture;
3,847 elements, 35 rows,
x spacing 5 to 50 um,
y spacing 20 to 150 um,
10 μm wavelength.

3mm x 3mm aperture;
16,021 elements, 80 rows,
x spacing 5 to 25 um,
y spacing 20 to 55 um,
10 μm wavelength.

3mm x 3mm aperture;
53,601 elements, 125 rows,
x spacing 5 to 9 um,
y spacing 20 to 28 um,
10 μm wavelength.

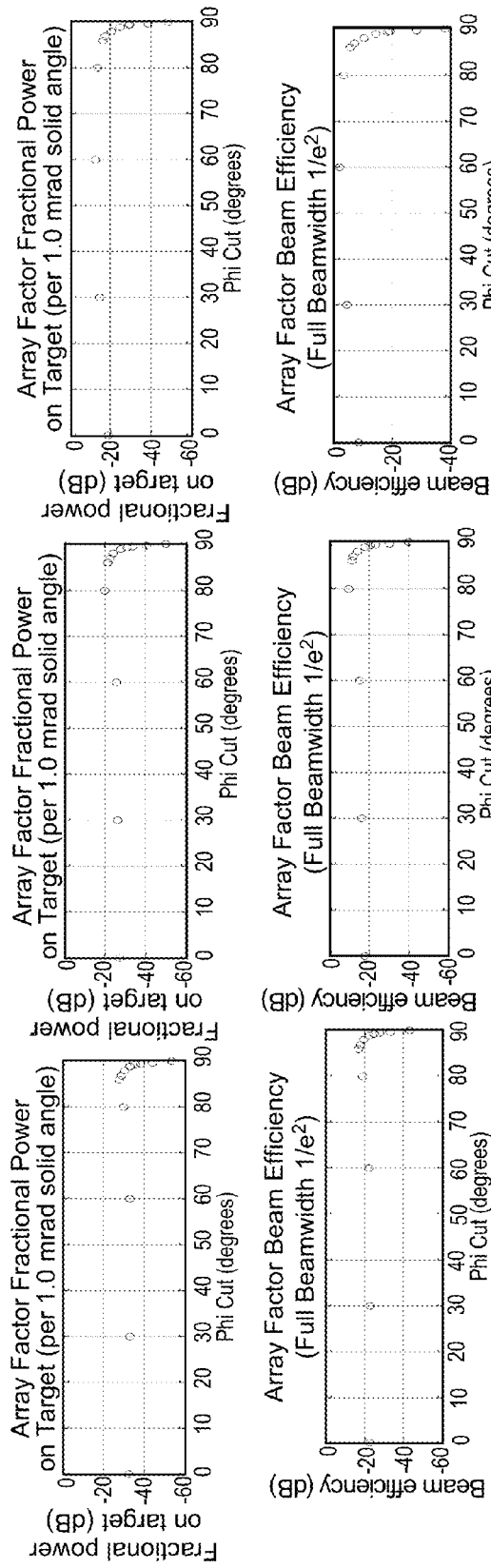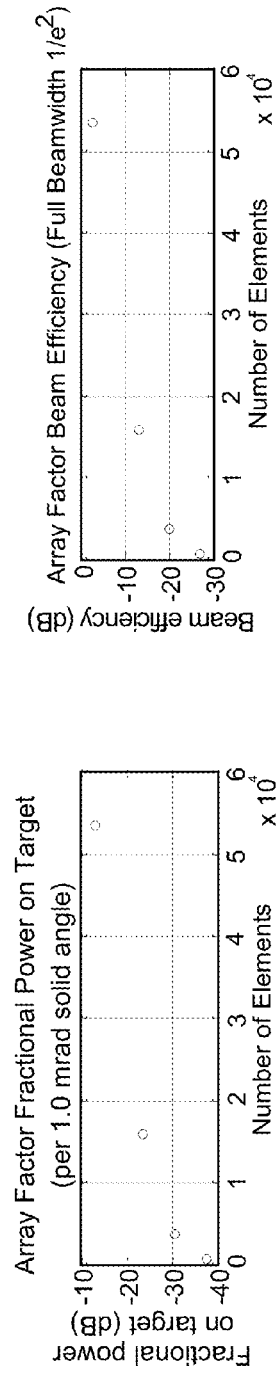
FIG. 19A
FIG. 19B
FIG. 19C
FIG. 20A
FIG. 20B

3mm x 3mm aperture;
10 μm wavelength,
15,998 elements,
x spacing 5 to 40 μm,
y spacing 20 to 30 μm,
120 rows 3mm x 3mm aperture;
10 μm wavelength,
16,021 elements,
x spacing 5 to 25 μm,
y spacing 20 to 55 μm,
80 rows 3mm x 3mm aperture;
10 μm wavelength,
16,495 elements,
x spacing 5 to 15 μm,
y spacing 20 to 90 μm,
55 rows 3mm x 3mm aperture;
10 μm wavelength,
16,399 elements,
x spacing 2.5 to 8.5 μm,
y spacing 20 to 180 μm,
30 rows

STACKED ROWS PSEUDO-RANDOMLY SPACED TWO-DIMENSIONAL PHASED ARRAY ASSEMBLY

CROSS REFERENCE TO RELATED APPLICATIONS

The present disclosure claims priority of U.S. provisional application No. 61/829,194, filed on May 30, 2013 and entitled "MULTI-WAVELENGTH OPTICAL BEAM FORMER", which is hereby incorporated by reference.

REFERENCE TO A CONTRACT

This disclosure relates to work performed under Government contract No. N00014-13-C-0036; entitled "MULTI-BAND OPTICAL PHASED ARRAY BEAM FORMER".

INCORPORATION BY REFERENCE

The present disclosure relates to co-pending U.S. patent Ser. No. 14/290,986, filed on May 29, 2014 and entitled: "MULTI-SLICE TWO-DIMENSIONAL BEAM FORMER ASSEMBLY", which is hereby incorporated by reference.

The present disclosure relates to co-pending U.S. patent Ser. No. 14/290,979, filed on May 29, 2014 and entitled: "MULTI-WAVELENGTH BAND OPTICAL PHASE AND AMPLITUDE CONTROLLER", which is hereby incorporated by reference.

TECHNICAL FIELD

The present disclosure relates to phased arrays, and in particular to a two-dimensional optical phased array provided for independently emitting or receiving directional light beams having two or more different wavelengths.

BACKGROUND

A two-dimensional optical phased array, or beam former, can for example be used in an infra-red counter measures (IRCM) system, for directing a high-power beam of potentially multi-band light at the optical aperture of a threat to dazzle and jam its optical seekers. These phased arrays can improve the survivability of military and commercial platforms under attack from threat munitions and missiles that may be guided by a variety of electro-optic (EO) and infrared (IR) seeker types, such as semi-active laser (SAL) designator sensors and EO/IR imagers that sense one or multiple wavelength bands, with these seekers often sharing the same optical aperture. For at least these reasons, two-dimensional optical phased arrays are of interest to providers of military and commercial aircraft, as well as to any commercial developer of IRCM systems for military and civilian applications.

A two-dimensional optical phased array can also be used in compact laser radar systems. Such systems are used as altimeters for aircraft (including rotorcraft). Such systems also are envisioned for some automobiles. An advantage of a phased array is its large field of regard and fast beam steering, which means that one phased array could take the place of 4 to 10 or more small mechanical or micro-electromechanical (MEM) beam steerers.

Current approaches for mechanical beam steering use gimbals that are not conformal, have slow response for large slews, and are capable of engaging only one threat at a time. To be specific, the gimbal must protrude beyond the outer-mold-line of the platform, it has fairly slow slew rates of >100 millisecond for 120 degrees of slew, and it requires a separate optical aperture for each of the multiple beams, thus enlarging the size and reducing the speed of the gimbal further.

Until recent years, the state-of-the-art for non-mechanical bi-dimensional optical beam steering devices was a liquid crystal based optical phased array, such as described in the document by P. F. McManamon, T. A. Dorschner, D. C. Corkum, L. J. Friedman, D. S. Hobbs, M. K. O. Holz, S. Liberman, H. Nguyen, D. P. Resler, R. C. Sharp, and E. A. Watson, entitled "Optical phased array technology," Proceedings of IEEE, Vol. 84, No. 2, pp. 268-298, 1996. This typically consists of a liquid crystal cell with one-dimensional pattern of transparent conductor strips in which each strip defines an element of the linear array. For beam steering in both the azimuth and elevation directions, two such liquid crystal cells are arranged in orthogonal orientations. liquid crystal based optical phased array is a fairly mature technology with very low power consumption due to the capacitive nature of the liquid crystal.

However, a main limitation of the liquid crystal based optical phased array is its slow steering speed (10's of millisecond range) which is due to the slow response time of the liquid crystal-based phase shifting elements. Another disadvantage of liquid crystals is that they operate over a limited temperature range. At low temperatures (<20° C.) the liquid crystal response time significantly degrades due to its increased viscosity, while at higher temperatures (>50° C.) the liquid crystal becomes isotropic and hence loses its functionality. Consequently, for practical purposes, the operating temperature of the liquid crystal based optical phased array should be externally controlled, which further adds to its complexity.

Another problem with the liquid crystal based optical phased array is the presence of grating lobes in the steered beam, which not only severely reduces the optical efficiency of the phased array but also requires complex signal detection circuitry when used in a receiver. In order to eliminate grating lobes in phased arrays, the spacing between array elements must be smaller than the wavelength of the steered beam. In liquid crystal based optical phased arrays, the array element (strip) widths are in the range of 5 to 10 μm, and hence larger than the wavelength of the optical beam in the UV, visible, NIR, and MWIR regions. Reducing the strip width below 5 μm results in a significant field-fringing effect and correspondingly reduces the electro-optic efficiency of the device, since the thickness of the liquid crystal cell is about 4 μm.

There exist prior techniques that can achieve faster scan speeds than liquid crystals, which involve phase modulation via an electrically or thermally controlled index change in semiconductors or electro-optic polymers. For example, one beam steering approach is based on the use of integrated AlGaAs waveguide arrays on a GaAs substrate in which each array element is a tunable phase shifter, such as described in the document from F. Vasey, F. K. Reinhart, R. Houdre, and J. M. Stauffer, entitled "Spatial optical beam steering with an AlGaAs integrated phased array," Appl. Opt. 32, pp. 3220-3232, 1993.

FIG. 1 illustrates a known optical phased array 10 using optical-waveguide devices to accomplish phase shifting and amplitude adjustment of light from a light source 12, such as disclosed in: "T. E. Dilon, C. A. Schuetz, R. D. Martin, D. G. Mackrides, P. F. Curt, J. Bonnet, and D. W. Prather, "Non-mechanical Beam Steering Using Optical Phased Arrays," Proc. of SPIE, Vol. 8184, 81840F, pp. 1-11, 2011".

A linear array of optical-waveguide phase shifters 20 placed side by side provides phase shifts of light from light source 12, after it is split by an optical splitter 22. Optical waveguide phase shifters achieve a 0 to 2π range of phase shift in one phase shifter by controlling a voltage or current applied to the electrodes of the phase shifter.

A series of high output power optical amplifiers 30 is provided to adjust the amplitude of the output of each phase shifter 20. Flexible optical fibers 40 connect each output of amplifiers 30 to an optical emitter output aperture 42 of an emitter surface 44 that comprises a desired two dimensional pattern of emitter output apertures.

FIG. 2 illustrates a front view of an emitter surface 44 having a desired two dimensional pattern of emitter output apertures 42 as illustrated in FIG. 1. Emitter output aperture 42 are arranged along a non-uniform spacing on surface 34 to eliminate the dominant grating lobes and reduce the larger side lobes of the phased array.

An important limitation of using optical fibers is that the minimum spacing between adjacent emitter is very large and thus the average side lobe power is fairly high. Also, since the size of the optical mode in a fiber is large compared to the wavelength of the light, the field of regard is very small (approximately 1 degree). For at least the above reasons, achieving a two-dimensional optical phased array using one or more mono-dimensional arrays of phase shifters and capable of steering an output optical beam over a large field of regard (e.g., +45-60°) along two orthogonal axes has been difficult.

Another deficiency of known phased arrays such as phased array 10 is that the phase of the light output from the fibers 40, 48 can fluctuate as a result of mechanical vibrations or changes in ambient temperature, thus detrimentally affecting the operation of optical phased array 10.

A two-dimensional optical phased array 71 that consists of a stack of one-dimensional optical phased array slices 72 is illustrated in FIG. 3A. Such two-dimensional optical phased array is described in an article by A. Hosseini, D. Kwong, Y. Zhao, Y.-S. Chen, F. Crnogorac, R. F. W. Pease, and R. T. Chen, "Unequally spaced waveguide arrays for silicon nanomembrane-based efficient large angle optical beam steering," IEEE J. Selected Topics in Quantum Electronics, Vol. 15, No. 5, pp. 1439-1446, 2009. A 1D optical phased array with non-uniform emitter spacing uses thermo-optic phase shifters fabricated in silicon waveguides is for example described in the document from D. Kwong, A. Hosseini, Y. Zhang, and R. T. Chen, entitled "1×12 Unequally spaced waveguide array for actively tuned optical phased array on a silicon nanomembrane," Applied Physics Letters, Vol. 99, 051104, 2011.

Each slice 72 of the array consists of a silicon nanomembrane, with a suggested approach for constructing an assembly of multiple slices being a nanomembrane transfer technique described in a document by W. Peng, et al., entitled "Single-crystal silicon/silicon dioxide multilayer heterostructures based on nanomembrane transfer", Applied Physics Letters, Vol. 90, pp. 183107-1-183107-3, 2007. As described in the article by Peng, et al., a silicon nanomembrane is formed by etching the silicon dioxide layer of a silicon-on-insulator chip, then transferring the thin silicon membrane layer to form a stack of multiple nanomembrane layers. Spin-on-glass can be deposited onto each of the transferred nanomembrane layers to separate that layer from a subsequent nanomembrane layer. Each silicon nanomembrane layer can have a thickness of approximately 100 nm. Optical phased array elements 73 can be formed on the nanomembrane layer, with control contacts 74 arranged on the edge of the nanomembrane layer.

FIG. 3B illustrates a known two-dimensional RF phased array assembly 60 having a two-dimensional array 62 of RF emitters 64. An assembly such as 60 is described in an article by L. Schulwitz and A. Mortazawi, "A Tray Based Rotman Lens Array with Beamforming in Two Dimensions for Millimter-Wave Radar," IEEE Intl. Symposium on Phased Array Systems and Technology (ARRAY), pp. 850-853, October 2010". Assembly 60 comprises a plurality of mono-dimensional phased array boards 66 that are placed on top of each other. In assembly 60, the boards 66 are secured at one end to a first mechanical structure supporting array 62 and at an opposite end to a second mechanical structure 68. Array 62 and structure 68 are secured to a base 69. Each board 66 comprises a Rotman lens 70 with a mono-dimensional array of outputs (not shown) connected each to an emitter horn antenna 64 of array 62. The electrical connections to each of the boards 66 are made by means of wires (not shown) that are connected to the side edges of boards 66.

A phased array comprised of emitters 64 arranged regularly such as array 62 of FIG. 3B have grating lobes at angles $\theta_{gl}$ given by:

$$\sin(\theta_{gl}) - \sin(\theta) = \frac{n\lambda}{d}$$

where θ is the scan angle, n is an integer, Δ is the wavelength, and d is the array spacing. Typical RF phased arrays have element spacing on the order of λ/2, which enables scanning over a 180° field of regard without the formation of grating lobes.

However, it is difficult to fabricate an optical phased array having a λ/2 element spacing, especially for phased arrays that operate overall the SWIR, MWIR1, MWIR2 or LWIR wavelength bands. For example, the spacing of the emitters of an array as shown in FIG. 3A can be smaller than λ/2 for LWIR light along an x-axis of the array but larger than A along the y-axis. Also, for an array having emitters emitting lights of more than one wavelength, an emitter spacing smaller than λ/2 for a first light (e.g. LWIR) can be larger than λ for a second light (e.g. SWIR light). As an illustrative example, consider a multi-band array that is designed for a minimum element spacing at the longest wavelength $\lambda_{max}$ (e.g., $d_{min}=\lambda_{max}/2=5$ μm for the case of $\lambda_{max}=10$ μm wavelength). The fixed minimum physical spacing between emitters can correspond to a distance of multiple wavelengths for the shortest wavelength $\lambda_{min}$ of operation (e.g., $d_{min}=5$ μm=3.3·$\lambda_{min}$ for the case of $\lambda_{min}=1.5$ μm). For an element spacing of 2λ, the first grating lobes occur at ±30° from the main beam. Assuming a Gaussian beam, the beam divergence for a 2λ aperture is ±32°, and therefore, the grating lobe will not be cancelled by the element factor. This problem is exaggerated by scanning. For the above example with the main beam pointed at 5°, there is a grating lobe at −25°. Accordingly, a different approach is required to deal with the grating lobes of an optical phased array.

RF phased arrays with non-uniform element spacing have been studied extensively, for example in the document from B. D. Steinberg entitled: "Principles of Aperture and Array System Design", Wiley-Interscience, New York, 1976; or in the document from C. A. Balanis entitled: "Antenna Theory: Analysis and Design", $2^{nd}$ edition, Wiley, New York, Sections 3.6, 6.10, 12.2, and 12.3, 1997; or in the document from R. J. Mailloux entitled "Phased Array Antenna Handbook", Artech House, Boston, 1994.

However, there exists a need for a two-dimensional optical phased array that produces beams that are free of grating lobes and that have low peak and average sidelobe levels for all emitted wavelengths. There also exists a need for a method for manufacturing such a two-dimensional optical phased array.

SUMMARY OF THE INVENTION

The present disclosure relates to a two-dimensional optical phased-array or beam former that is constructed as a stacked assembly of multiple chips or substrates containing optical phased-array elements comprising optical waveguide structures, metal electrodes and interconnects and dielectric filling material. The stack can be electrically and mechanically coupled to an electronic integrated circuit that provides the control signals for controlling the phase and amplitude of the light emitted from (or received by) the phased-array elements of the chips. The optical phased array is a reversible structure that can have an output optical beam emitted from its emitter apertures pointed at a particular far-field direction. The array also can collect light, via its emitter apertures, from a particular far-field direction. According to the present disclosure, each chip of the two-dimensional phased array has a height that varies within a predetermined range according to a pseudo-random pattern, and each chip has an emitter side with emitters distant from each other according to a pseudo-random pattern.

The present disclosure also describes a method for fabricating such a stacked assembly of multiple slices or chips.

An embodiment of the present disclosure comprises an optical phased array beam former module that can form and point one or more simultaneous beams of light having energy in two or more wavelengths. These wavelengths may be in different portions of the same wavelength band or in different wavelength bands (e.g., the SWIR, MWIR1, MWIR2, and LWIR spectral bands). The beam pointing direction can be steered in 2 dimensions, e.g., in both azimuth and elevation, over a large (e.g., >120°) field of regard. According to an embodiment of the present disclosure, the multiple wavelengths of light are output from (or collected by) a same array of emitter-apertures that form a single, compact overall aperture. The beam former is described in the present disclosure as operating in a transmit mode, with the emitter-apertures emitting light. However, the beam former is a reversible optical element and can be used both in an optical transmitter and in an optical receiver. The light of each wavelength comprises energy at a single wavelength or energy that is distributed over a relatively small bandwidth compared to the width of its band.

An embodiment of the present disclosure comprises an optical phased array beam former module that comprises a stack of multiple mono-dimensional phased array slices, wherein each slice contains multiple optical channels, with each channel configured to conduct light comprising all of the 3 or more wavelength bands and to modify separately the amplitude and phase of the light in each of those wavelength bands. According to an embodiment of the present disclosure, a separate multi-band optical channel is associated with each emitter aperture (or emitter).

According to an embodiment of the present disclosure, the emitter apertures of the phased array are arranged as a pattern of two-axis pseudo-randomly spaced elements to produce beams that are free of grating lobes and have low peak and average sidelobe levels for all emitted wavelengths.

According to an embodiment of the present disclosure, the phased array is comprised of stacked slices, wherein the emitter apertures in each slice have pseudo-random spacing and different slices of the stack of slices have different patterns for the pseudo-random spacing of their emitters.

According to an embodiment of the present disclosure, the spacing between slices of the stack also is pseudo-random.

According to an embodiment of the present disclosure, the number of emitter apertures in a slice can be much larger than (e.g., more than two times greater than) the number of slices in the stack forming the bi-dimensional array of emitter apertures.

According to an embodiment of the present disclosure, the output aperture contains a bi-dimensional array of optical microlenses, with a microlens associated with each emitter aperture and each optical channel. According to an embodiment of the present disclosure, each microlens functions to increase the divergence of the shorter-wavelength light emitted from its emitter aperture.

According to an embodiment of the present disclosure, each emitter aperture also includes a metal-walled optical-waveguide taper, which functions to prevent optical crosstalk between adjacent array elements and which also functions to increase the divergence of the longer-wavelength light emitted from that aperture.

According to an embodiment of the present disclosure, each channel includes a multi-band optical phase shifter that can separately modify the phase of the light in each of the wavelength bands.

According to an embodiment of the present disclosure, the beam former includes multi-band amplitude adjusters that comprise optical splitters (or combiners for a receiver) that can separately adjust the amplitudes of the light at the output of the splitters, with a total of one splitter-output per channel, and in each of the wavelength bands in each channel.

According to an embodiment of the present disclosure, the beam former includes multi-band input waveguide segments configured to distribute different wavelengths of the input light into different portions of the multi-band waveguide.

According to an embodiment of the present disclosure, the beam former includes an array of optical microlenses that focus input light into the multi-band input waveguide segments, with one microlens associated with each input waveguide segment.

According to an embodiment of the present disclosure, the beam former module is adapted to form and steer multiple simultaneous output beams from a same aperture.

According to an embodiment of the present disclosure, the beam former module is adapted to form and steer the beams in a response time of approximately 1 millisecond or less.

According to an embodiment of the present disclosure, the beam former module is adapted to form and steer beams comprised of up to three wavelengths, with a wavelength in different ones of the SWIR, MWIR1, MWIR2 and LWIR bands (spanning a range from 1.5 μm to over 10 μm wavelength).

According to an embodiment of the present disclosure, the beam former module is adapted to form beams that have negligible sidelobes and steer those beams over a >120° field of regard in two orthogonal axes.

A phased array optical beam former module according to an embodiment of the present disclosure is adapted to independently and simultaneously point and steer multiple beams comprising light in three wavelength bands through a single, compact output aperture. The positions of the output beams and their wavelengths can be changed in a response time of less than 1 millisecond, which is particularly advantageous for realizing simultaneous wavelength-agile search, track, spoof, and jam in infrared counter measures (IRCM) systems. A phased array optical beam former module according to an embodiment of the present disclosure is a compact and mechanically rigid block (see FIG. 6B, detailed below) that can readily be integrated with a CMOS electronic controller circuit to achieve a beam forming module whose size is smaller than 2-5 $cm^3$ and whose performance has minimal sensitivity to ambient-temperature or vibration. Compared to state-of-the-art non-mechanical bi-dimensional beam steering alternatives, a phased array optical beam former module according to an embodiment of the present disclosure is more stable, is compatible with a variety of laser sources and laser wavelengths over multiple bands, and can simultaneously form and steer multiple beams over a larger field of regard and with faster response times. Other known compact approaches such as those based on MEMs mirrors or meta-materials (periodic metal structures) either are adapted to producing only one beam or beams comprising only one wavelength, have small field-of-regard, or are large and bulky.

An embodiment of the present disclosure relates to a phased array that comprises a predetermined number of emitter/receiver elements; said emitter/receiver elements being arranged on a array formed of stacked rows, wherein the emitter/receiver elements in each row of the array are distributed according to a pseudo-random pattern; and the heights of the rows vary according to a pseudo-random pattern.

According to an embodiment of the present disclosure, the height of the rows varies within a first predetermined range along a first pseudo random pattern.

According to an embodiment of the present disclosure, the emitter/receiver elements of each row are formed on a side edge of a row substrate; said array being formed by stacking together the row substrates.

According to an embodiment of the present disclosure, the emitter/receiver elements in each row of the array are distributed according to a pseudo-random pattern by having the distance between two consecutive emitter/receiver elements in each row vary within a second predetermined range along a second pseudo random pattern.

According to an embodiment of the present disclosure, the number of emitter/receiver elements in each row of the array is more than two times greater than the number of rows of the array.

According to an embodiment of the present disclosure, the density of the emitter/receiver elements varies spatially over different portions of the array.

According to an embodiment of the present disclosure, the array has a center and has edges, and wherein the density of the emitter/receiver elements is larger near the center of the array and smaller near the edges of the array.

According to an embodiment of the present disclosure, the emitter/receiver elements are optical emitter/receiver elements.

According to an embodiment of the present disclosure, the emitter/receiver elements are adapted to emitting and/or receiving light having at least first and second wavelengths.

According to an embodiment of the present disclosure, each emitter/receiver elements comprises a single aperture adapted to emitting and/or receiving the first and second wavelengths.

According to an embodiment of the present disclosure, each emitter/receiver element comprises a lens coupled to said single aperture.

According to an embodiment of the present disclosure, said single aperture of each emitter/receiver elements has first and second beamwidths for respectively the first and second wavelengths.

According to an embodiment of the present disclosure, said lens is adapted to affect differently the beamwidths of the first and second wavelengths and wherein said single aperture of each emitter/receiver elements, coupled to said lens, has similar beamwidths for the first and second wavelengths.

According to an embodiment of the present disclosure, the first wavelength is shorter than the second wavelength; and wherein said single aperture of each emitter/receiver elements has a larger beamwidth for the second wavelength than for the first wavelength.

According to an embodiment of the present disclosure, the lens coupled to said single aperture is adapted to increase the divergence of light of the first wavelength emitted from said single aperture.

According to an embodiment of the present disclosure, the lenses coupled to the apertures of each emitter/receiver element are arranged as an array of micro-lenses coupled to the array.

According to an embodiment of the present disclosure, said single aperture of each emitter/receiver elements is coupled to an end of a first waveguide having a first refraction index and dimensioned to confine a mode of the light of first wavelength; wherein a second waveguide, having a second refraction index smaller than the first refraction index is coupled to the first waveguide and tapers toward the aperture from dimensions enabling the second waveguide to confine a mode of the light of second wavelength to a null thickness; the first and second metal waveguides being clad with metal.

According to an embodiment of the present disclosure, the first and second waveguides are coupled to a multi-band phase shifter adapted to controllably modify the phase of each of the light of first and second wavelengths.

According to an embodiment of the present disclosure, the first and second waveguides are coupled to a multi-band amplitude adjuster adapted to controllably modify the amplitude of each of the light of first and second wavelengths.

An embodiment of the present disclosure also relates to a phased array that comprises a predetermined number of emitter/receiver elements; said emitter/receiver elements being arranged on a array formed of stacked rows, wherein the emitter/receiver elements in each row of the array are distributed according to a pseudo-random pattern; and each row has a same height.

According other embodiments of the present disclosure, the emitter/receiver elements of each row are formed on a side edge of a row substrate; said array being formed by stacking together the row substrates.

According to said other embodiments of the present disclosure, the emitter/receiver elements in each row of the array are distributed according to a pseudo-random pattern by having the distance between two consecutive emitter/receiver elements in each row vary within a predetermined range along said pseudo random pattern.

According to said other embodiments of the present disclosure, the number of emitter/receiver elements in each row of the array is more than two times greater than the number of rows of the array.

According to said other embodiments of the present disclosure, the density of the emitter/receiver elements varies spatially over different portions of the array.

According to said other embodiments of the present disclosure, the array has a center and has edges, and wherein the density of the emitter/receiver elements is larger near the center of the array and smaller near the edges of the array.

According to said other embodiments of the present disclosure, the emitter/receiver elements are optical emitter/receiver elements.

According to said other embodiments of the present disclosure, the emitter/receiver elements are adapted to emitting and/or receiving light having at least first and second wavelengths.

According to said other embodiments of the present disclosure, each emitter/receiver elements comprises a single aperture adapted to emitting and/or receiving the first and second wavelengths.

According to said other embodiments of the present disclosure, each emitter/receiver element comprises a lens coupled to said single aperture.

According to said other embodiments of the present disclosure, said single aperture of each emitter/receiver elements has first and second beamwidths for respectively the first and second wavelengths.

According to said other embodiments of the present disclosure, said lens is adapted to affect differently the beamwidths of the first and second wavelengths and wherein said single aperture of each emitter/receiver elements, coupled to said lens, has similar beamwidths for the first and second wavelengths.

According to said other embodiments of the present disclosure, the first wavelength is shorter than the second wavelength; and wherein said single aperture of each emitter/receiver elements has a larger beamwidth for the second wavelength than for the first wavelength.

According to said other embodiments of the present disclosure, the lens coupled to said single aperture is adapted to increase the divergence of light of the first wavelength emitted from said single aperture.

According to said other embodiments of the present disclosure, the lenses coupled to the apertures of each emitter/receiver element are arranged as an array of microlenses coupled to the array.

According to said other embodiments of the present disclosure, said single aperture of each emitter/receiver elements is coupled to an end of a first waveguide having a first refraction index and dimensioned to confine a mode of the light of first wavelength; wherein a second waveguide, having a second refraction index smaller than the first refraction index is coupled to the first waveguide and tapers toward the aperture from dimensions enabling the second waveguide to confine a mode of the light of second wavelength to a null thickness; the first and second metal waveguides being clad with metal.

According to said other embodiments of the present disclosure, the first and second waveguides are coupled to a multi-band phase shifter adapted to controllably modify the phase of each of the light of first and second wavelengths.

According to said other embodiments of the present disclosure, the first and second waveguides are coupled to a multi-band amplitude adjuster adapted to controllably modify the amplitude of each of the light of first and second wavelengths.

BRIEF DESCRIPTION OF THE DRAWINGS

FIG. 5A illustrates the positions of the emitters of a phased array according to an embodiment of the present disclosure.

FIG. 5B illustrates the normalized intensity with respect to the far-field angle of two simultaneous beams produced by the phased array of FIG. 5A.

FIGS. 5C and 5D detail FIG. 5B for a first far field angle.

FIGS. 5E and 5F detail FIG. 5B for a second far field angle.

FIGS. 19A, 19B and 19C illustrate the fractional power on target and beam efficiency for different angles of steering for the phased arrays of FIGS. 18A, 18B, and 18C.

FIGS. 20A and 20B summarize the fractional power on target and beam efficiency per number of emitters for the phased arrays of FIGS. 18A, 18B, and 18C.

DETAILED DESCRIPTION

In the following description, numerous specific details are set forth to clearly describe various specific embodiments disclosed herein. One skilled in the art, however, will understand that the presently claimed invention may be practiced without all of the specific details discussed below. In other instances, well known features have not been described so as not to obscure the invention.

Figure 1:
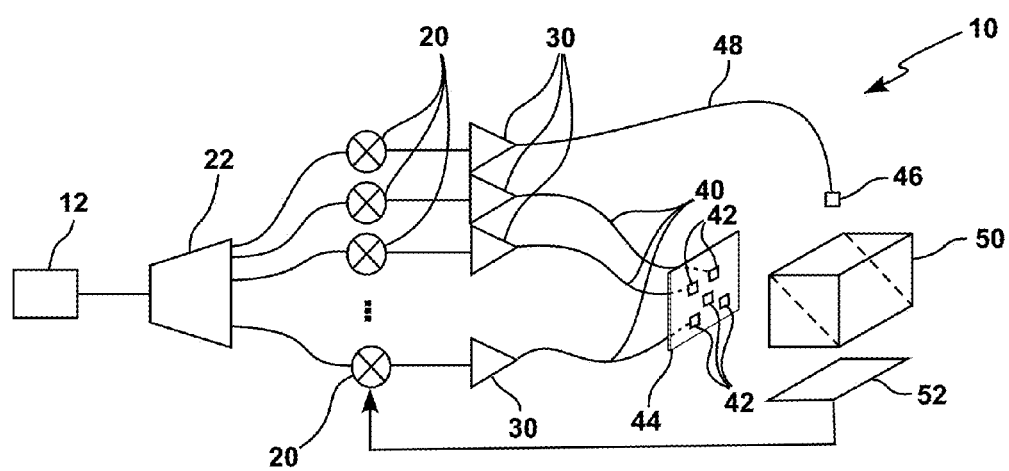
FIG. 1 illustrates a known optical phased array using optical-waveguide devices.
Figure 2:
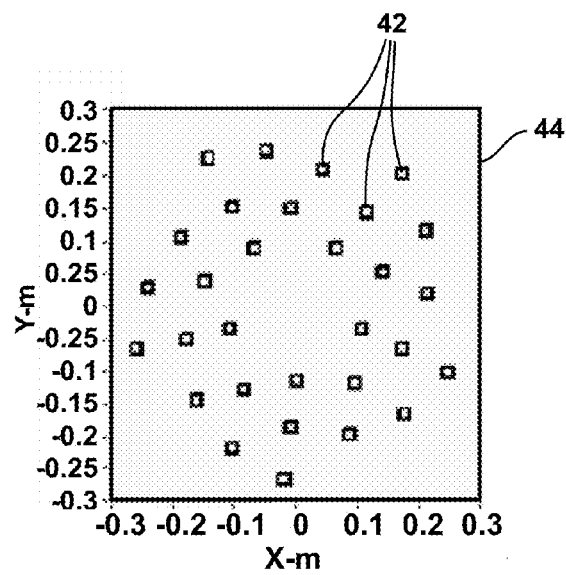
FIG. 2 illustrates a front view of an emitter surface of the phased array of FIG. 1.
Figure 3A:
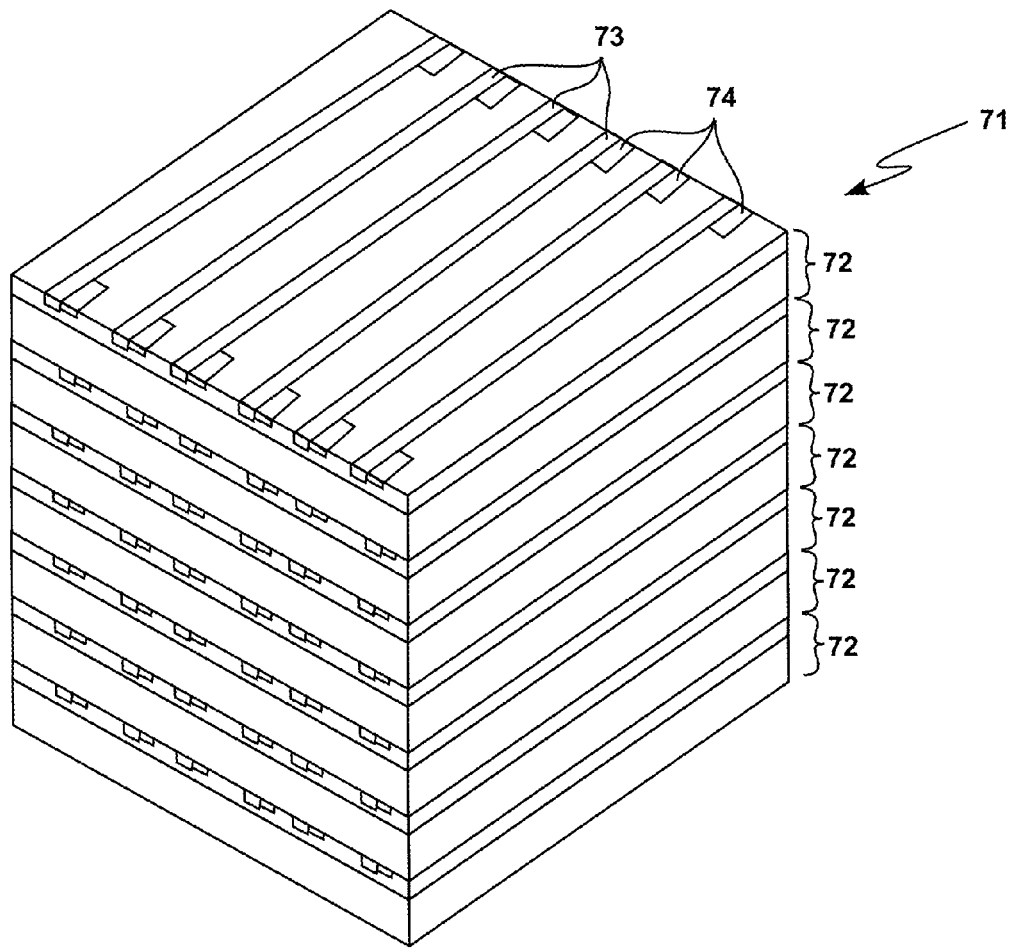
FIG. 3A illustrates a known two-dimensional optical phased array assembly having a plurality of silicon nano-membranes each containing optical phased array elements.
Figure 3B:
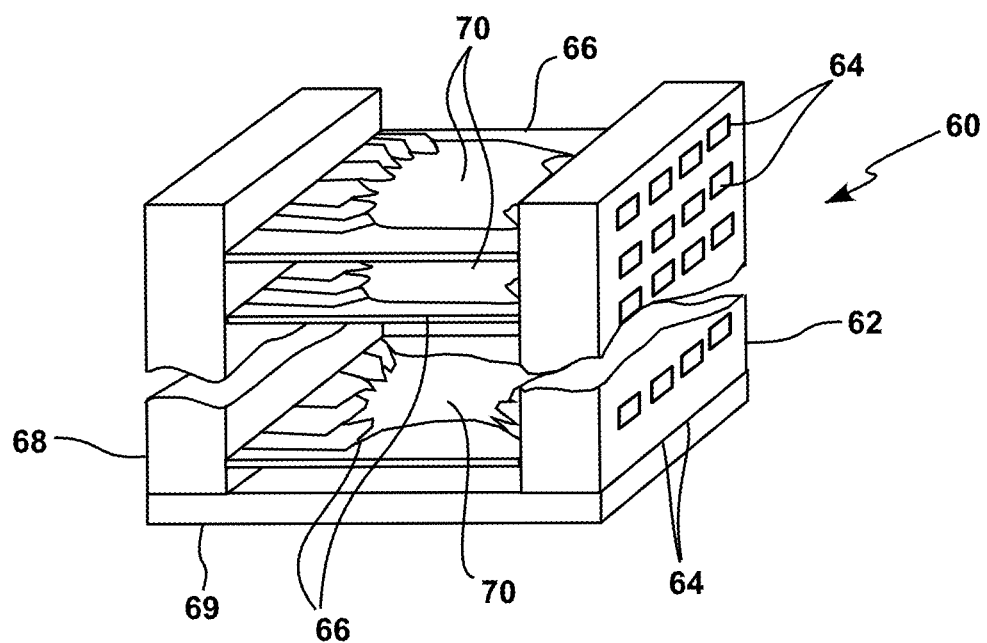
FIG. 3B illustrates a known two-dimensional RF phased array assembly having a plurality of mono-dimensional RF emitter boards.
Figure 4A:
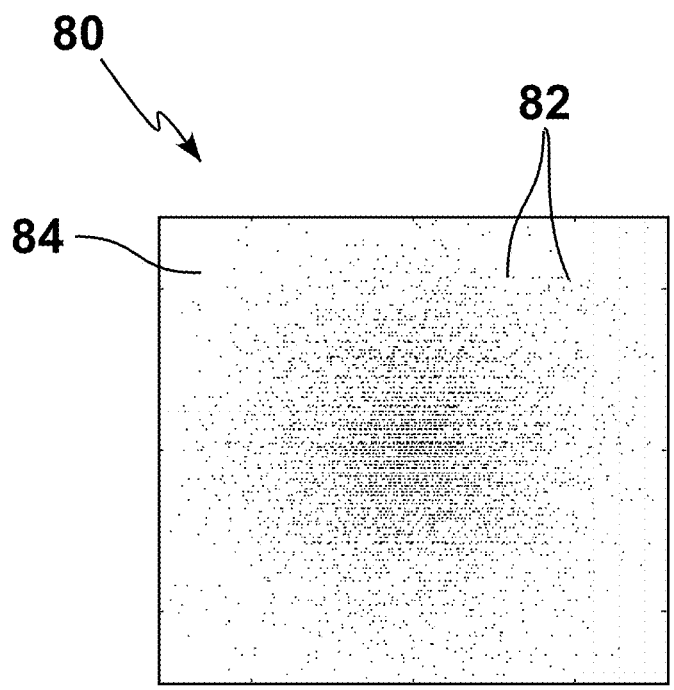
FIG. 4A illustrates the positions of the emitters of an optical phased array according to an embodiment of the present disclosure.

FIG. 4A shows a front view of a phased array 80 according to an embodiment of the present disclosure, comprising a predetermined number of optical emitter/receiver elements 82 arranged along an array 84 comprising stacked rows, wherein the optical emitter/receiver elements 82 in each row of the array are distributed according to a pseudo-random pattern; and the height of each row varies according to a pseudo-random pattern. According to an embodiment of the present disclosure, the height of each row varies within a first predetermined range along a first pseudo random pattern. Similarly, the emitter/receiver elements 82 in each row of the array 84 are distributed according to a pseudo-random pattern by having the distance between two consecutive emitter/receiver elements 82 in each row vary within a second predetermined range along a second pseudo random pattern.

According to an embodiment of the present disclosure, the number of emitter/receiver elements 82 in each row of the array is more than two times greater than the number of rows of the array. In the embodiment illustrated in FIG. 4A, the density of the emitter/receiver elements 82 (number of emitter/receiver elements per unit area) varies spatially over different portions of array 84, and in particular the density of the emitter/receiver elements 82 is larger near the center of array 84 and smaller near the edges of array 84. A Gaussian density distribution is depicted in FIG. 4A. The exemplary size of array 84 is 3 mm by 3 mm, where array 84 comprises a vertical stack of 130 slices (or rows or substrates) and has a total of 3941 emitter/receiver elements 82 (averaging 30.3 emitter/receiver elements 82 per slice). In the illustrated example, the assigned spacing between adjacent pseudo-random spaced elements ranges from 10 to 20 μm horizontally (in a row, or along an x-axis) and 15 to 30 μm vertically (along a y-axis), when those elements are present. According to an embodiment of the present disclosure however, many emitter/receiver elements 82 are absent from their assigned locations, for example because of the Gaussian density taper. Thus the actual spacing between adjacent emitter/receiver elements 82 that are present in array 84 can be much larger than 20 μm horizontally or 30 μm vertically.

Figure 4B:
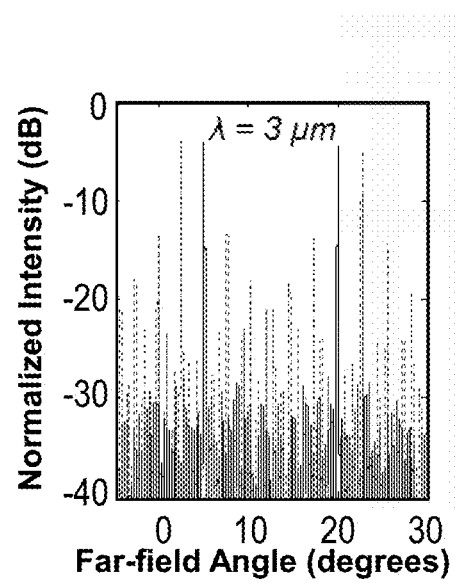
FIG. 4B illustrates the beam pattern of the phased array of FIG. 4A, compared to the beam pattern of a 2-D array having a periodic spacing.

FIG. 4B shows the calculated far-field pattern (shown in solid lines) when density-tapered array 84 is used to produce two simultaneous beams (at 3 μm wavelength) along a 5 and a 20 degree angle in a z-y plane. No grating lobes are produced. In contrast, FIG. 4B also shows the far field pattern (shown in dotted lines) for a phased array of the same overall 3 mm×3 mm exemplary size and having 8200 uniformly spaced elements (element spacing of approximately 11λ), which has many prominent grating lobes. It is noted that those grating lobes are observed even though the uniform-spacing array has more than twice as many elements as the exemplary array 84 according to the present disclosure, with two-axis pseudo-randomly spaced and density tapered elements.

FIG. 5A shows a front view of an exemplary 5 mm by 5 mm phased array 86 according to an embodiment of the present disclosure, comprising 15,635 optical emitter/receiver elements 82 arranged along an array 88 formed of stacked rows, wherein the optical emitter/receiver elements 82 in each row of the array and the heights of the rows are distributed according to pseudo-random patterns, but without density tapering when moving away from the center of the array. According to an embodiment of the present disclosure, emitter/receiver elements 82 are adapted to emitting and/or receiving light having two or more different wavelengths.

According to an embodiment of the present disclosure, phased array 86 comprises a stack of multiple plane slices, with each slice containing a one-dimensional array of emitter/receiver elements 82, wherein the emitter/receiver elements 82 in each slice have a pseudo-random, non-uniform spacing along the plane of that slice. Different slices can have different patterns of emitter spacing. The slices comprising the multi-slice stack array also have a non-uniform, pseudo-random thickness. The pseudo-random spacing enables a phased array according to the present disclosure to produce output beams that have no grating lobes and low side lobe energy.

FIG. 5A shows an example of the distribution of the emitter/receiver elements 82 in the two-axis array 88. The illustrated exemplary array 88 comprises 85 slices having each a thickness that varies within a predetermined range along a pseudo random pattern, with each slice containing roughly 190 pseudo-randomly spaced emitter elements, for a total of 15,635 elements. In the exemplary embodiment, the minimum element spacing is 5 μm horizontally (along a slice) and 20 μm vertically (along the stack), and the size of the output aperture/array 88 is 5 mm×5 mm.

FIG. 5B shows the calculated far-field pattern along the x-z plane for phased array 86. The calculated beam pattern illustrates that phased array 86 can for example produce two simultaneous beams over large steering angles with no grating lobes (unlike arrays of uniformly-spaced emitters).

One beam, located at 20° angle, comprises light of 4 and 10 μm wavelengths and a second beam, located at 60° angle, comprises light of 1.5 and 4 μm wavelengths. FIGS. 5C and 5D detail the beam pattern obtained for the 20° angle beam for the 4 μm (dotted line) and 10 μm (solid line) wavelengths, respectively in a 4° angle range and a 0.2° angle range. FIGS. 5E and 5F detail the beam pattern obtained for the 60° angle beam for the 4 μm (dotted line) and 1.5 μm (solid line) wavelengths, respectively in a 4° angle range and a 0.2° angle range.

According to an embodiment of the present invention, the amplitude and phase of the light in each wavelength that is output from each emitter can be controlled separately, as detailed hereafter. The 1.5 μm wavelength lies in the short-wave infrared (SWIR) band which typically covers wavelengths from 1-3 μm. The 4 μm wavelength lies in the mid-wave infrared 1 (MWIR1) band, which typically extends from 3-4.2 μm. The mid-wave infrared 2 (MWIR2) band typically extends from 4.2-5 μm. The 10 μm wavelength lies in the long-wave infrared (LWIR) band which typically covers optical wavelengths greater than 8 μm.

Figure 6A:
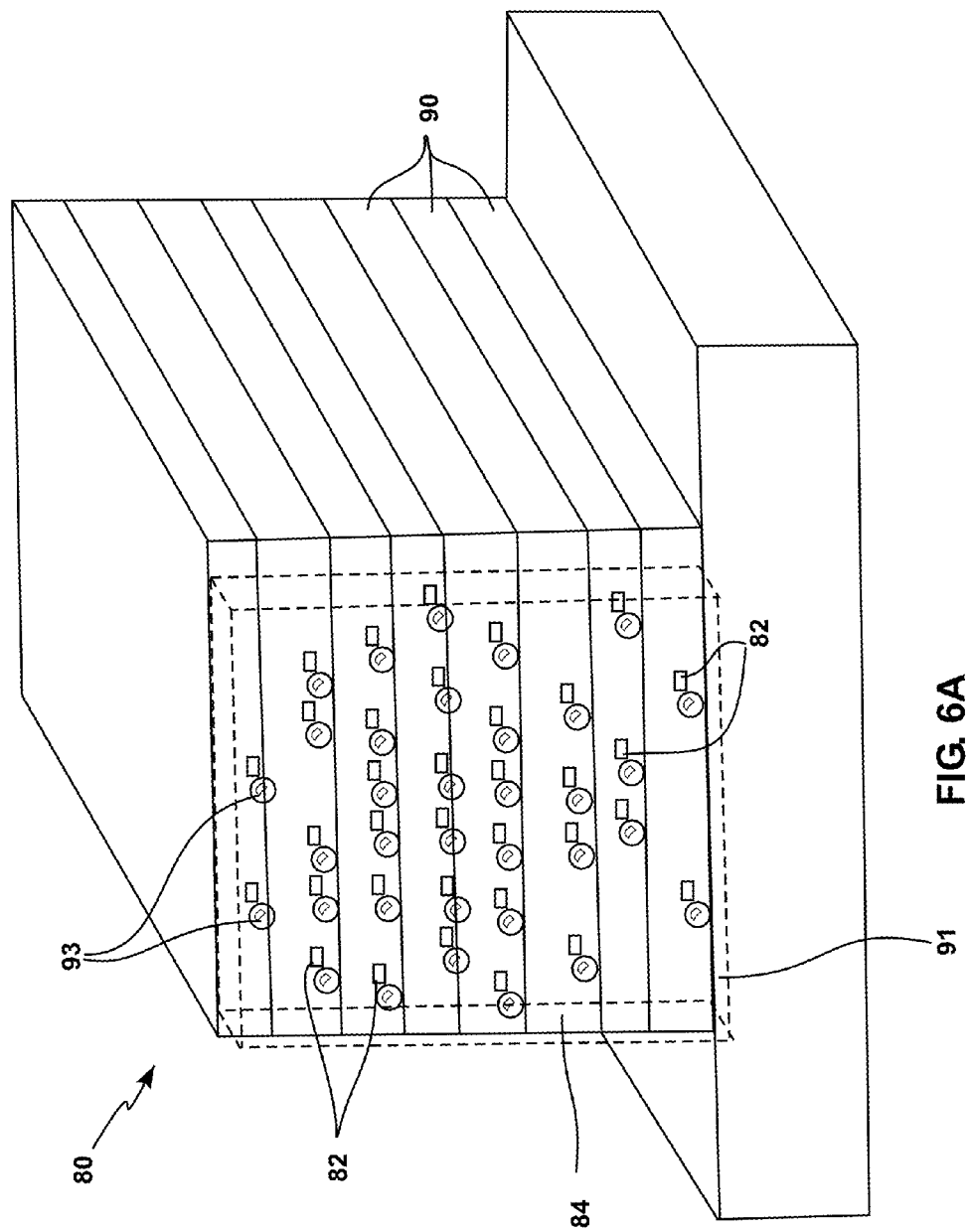
FIG. 6A is an elevation view of an optical phased array according to an embodiment of the present disclosure.

FIG. 6A is an elevation view of the phased array 80 of FIG. 4A. Phased array 80 comprises a plurality of slices/chips 90 stacked together. Each chip 90 has top and bottom surfaces as well as an emitter side surface comprising a plurality of optical emitter/receiver elements 82. The emitter side surfaces of the attached chips 90 face a same direction; the stacked chips thus forming the array 84 of optical emitter/receiver elements 82. The side of the chips 90 opposite their emitter side is preferably an input side that comprises optical inputs (shown hereafter); the stacked chips thus forming an input array (not shown). According to an embodiment of the present disclosure, an array of convergent microlenses can be arranged on the side of the stack comprising the input array, thus enabling the input array to receive light directly from a single light source.

According to an embodiment of the present disclosure, an array of divergent microlenses can be arranged on the side of the stack comprising the emitter array, thus increasing the field of regard of the array.

According to an embodiment of the present disclosure, the height of chips 90 varies within a predetermined range along a pseudo random pattern and the position of the optical emitter/receiver elements 82 along the emitter side of each chip 90 also varies within a predetermined range along a pseudo random pattern.

According to an embodiment of the present disclosure, an array 91 of micro lenses 93 can be coupled to array 84, such that one micro lens 93 is coupled to each optical emitter/receiver elements 82, along an axis normal to the surface of array 84.

Figure 6B:
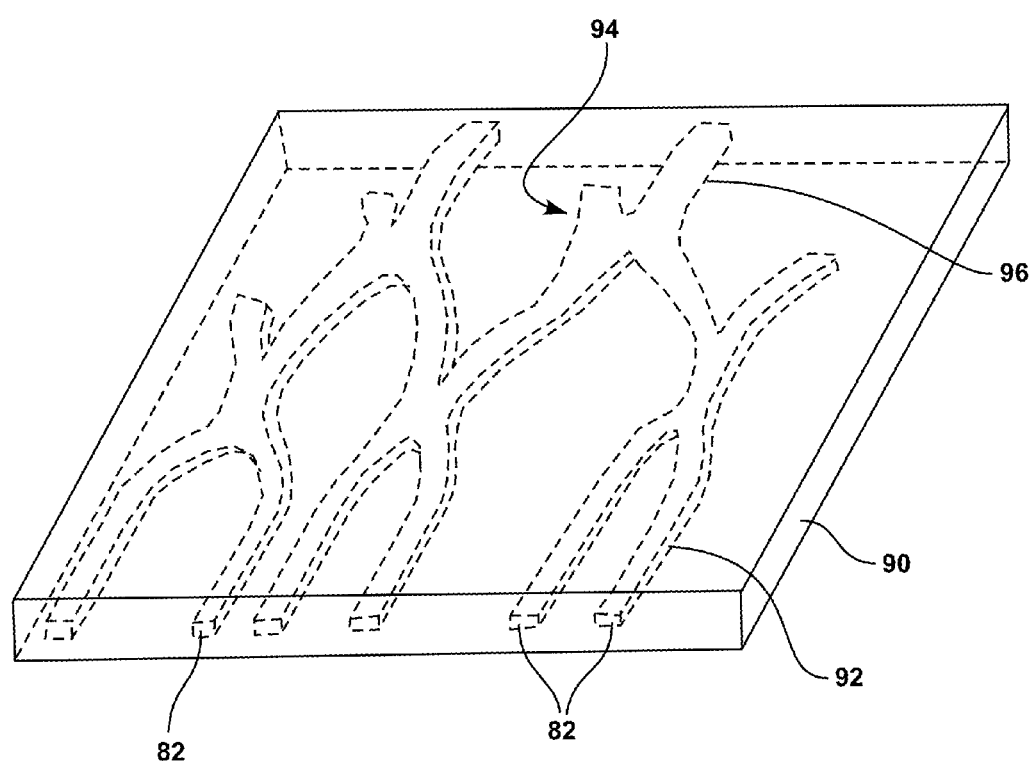
FIG. 6B is an elevation view of a portion of an optical phased array comprised of portions such as shown in FIG. 6A.

FIG. 6B is an elevation view of one chip 90 of FIG. 6A. According to an embodiment of the present disclosure, each optical emitter/receiver element 82 is coupled to an end of a waveguide assembly comprising at least an optical phase shifter section 92 coupled to an output of light amplitude adjuster section 94, coupled to an output of a light input waveguide section 96. According to an embodiment of the present disclosure, the waveguide section 96 opens to an input side of the chip 90, parallel to the emitter side of chip 90. According to an embodiment of the present disclosure, the waveguide section 96, the light amplitude adjuster section 94 and the optical phase shifter section 92 can be such as described in co-pending application Ser. No. 14/290,979, entitled: "MULTI-WAVELENGTH BAND OPTICAL PHASE AND AMPLITUDE CONTROLLER". According to an embodiment of the present disclosure, the structure of chip 90 is provided for controlling precisely the height of chip 90, and therefore the position along the y axis/vertical axis of the optical emitter/receiver elements 82 of the stacked chips 90, as described for example in co-pending application Ser. No. 14/290,986, entitled: "MULTI-SLICE TWO-DIMENSIONAL BEAM FORMER ASSEMBLY". According to an embodiment of the present disclosure, the distance between the consecutive optical emitter/receiver elements 82 of chip 90 varies within a predetermined range according to a pseudo random pattern. According to an embodiment of the present disclosure, if the density of the emitters tapers off when moving away from the center of the phased array, the optical emitter/receiver elements 82 of chip 90 can additionally be made sparse depending on the position in the stack for which chip 90 is made. Alternatively, the manufacturing of the phased array can be simplified by not making sparse the optical emitter/receiver elements 82 of chip 90 when manufacturing chip 90, and instead controlling the appropriate light amplitude adjuster sections 94 of chip 90 to dim the optical emitter/receiver elements 82 that are to not operate due to the density tapering off.

Alternatively, a phased array according to an embodiment of the present disclosure can be fabricated very simply with a minimal, periodic space between the optical emitter/receiver elements 82 of chip 90, and with chips 90 having all a same, minimal, height, and by controlling the appropriate light amplitude adjuster sections 94 of all the chips 90 of the phased array to dim a number of optical emitter/receiver elements 82 of the phased array chosen such that the non-dimmed optical emitter/receiver elements 82 are spread pseudo-randomly as detailed in the present disclosure. According to an embodiment of the present disclosure, the dimming of pseudo-randomly chosen optical emitter/receiver elements 82 can lead to dimming whole chips 90. According to an embodiment of the present disclosure, the dimming of pseudo-randomly chosen optical emitter/receiver elements 82 can be fine-tuned to minimize side lobes and grating lobes.

Figure 7:
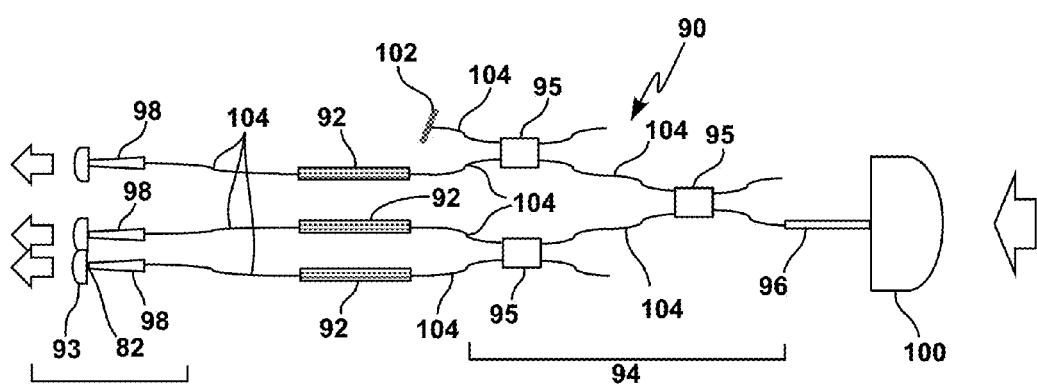
FIG. 7 illustrates a detail of the portion of optical phased array of FIG. 6B.

FIG. 7 schematically illustrates the elements coupled to each optical emitter/receiver elements 82 of each chip 90 of a phased array according to an embodiment of the present disclosure. Each optical emitter/receiver element 82 is coupled toward the exterior of chip 90 to a divergent lens 93. The properties of lens 93 are detailed hereafter. Toward the interior of chip 90, each optical emitter/receiver element 82 can be coupled to a waveguide taper 98, the structure of which is detailed hereafter. Further, each optical emitter/receiver element 82 is coupled to a assembly comprising at least an optical phase shifter section 92 coupled to an output of light amplitude adjuster section 94, coupled to an output of a light input waveguide section 96. Input waveguide section 96 is preferably coupled to a convergent lens 100. According to an embodiment of the present disclosure, the lenses 100 coupled to the input waveguide sections 96 of the phased array can be part of a microlens array coupled to the side of the phased array formed by the input sides of the stacked chips 90.

According to an embodiment of the present disclosure, light amplitude adjuster section 94 can comprise a coupler 95 having two input waveguides and two output waveguides, and adapted to directing to the outputs waveguides a controlled portion of the light received from the input waveguides. According to an embodiment of the present disclosure, an input or an output waveguide of a coupler 95 can be left unconnected. An unconnected input or output waveguide can be coupled to a light absorber. According to an embodiment of the present disclosure, light amplitude adjuster section 94 can comprise two couplers 95 or more, enabling for example to controllably direct the light received from a single input waveguide 96 into three or more optical emitter/receiver element 82. According to an embodiment of the present disclosure, amplitude adjuster section 94 can comprise one coupler having an output waveguide leading to an optical absorber 102, thus allowing to divert the light received by this amplitude adjuster section 94 into the absorber, thus allowing to extinguish all of the optical emitter/receiver element 82 coupled to this amplitude adjuster section 94.

According to an embodiment of the present disclosure, the waveguide taper 98, optical phase shifter section 92, light amplitude adjuster section 94, and light input waveguide section 96 can be coupled to each other by intermediary S-shaped waveguides 104 having the same structure as for example input waveguide section 96. The waveguides can be surrounded by a cladding material having a lower refractive index than the refractive indexes of the waveguides.

Figures 8, 9:
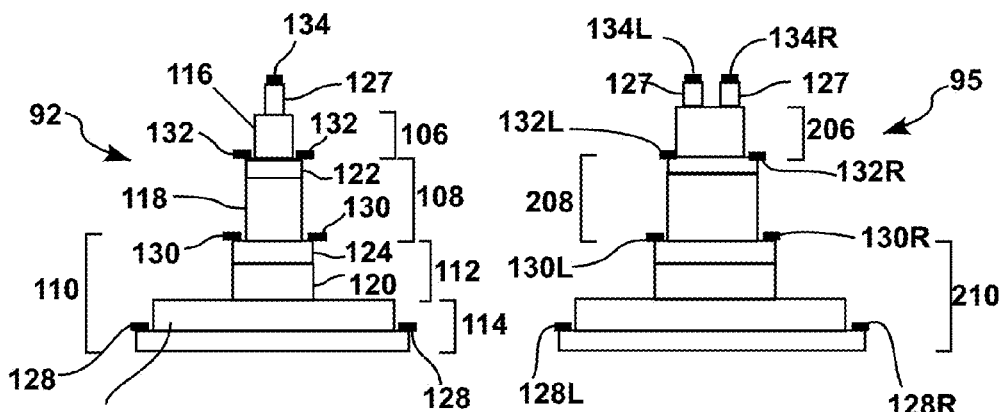
FIG. 8 is a cross-section view of an optical phase shifter as illustrated in FIG. 7.
FIG. 9 is a cross-section view of an optical coupler as illustrated in FIG. 7.

FIG. 8 is an axial cross section of an exemplary optical phase shifter 92. According to an embodiment of the present disclosure, optical phase shifter 92 comprises a first waveguide 106 having a first refraction index and dimensioned to confine a mode of the light of the shortest wavelength $\lambda 1$ to be emitted/received by the phased array, coupled along one side to a second waveguide 108, having a second refraction index smaller than the first refraction index and dimensioned to confine a mode of a second wavelength $\lambda 2$ to be emitted/received by the phased array. FIG. 8 shows a third waveguide 110 having a third refraction index smaller than the second refraction index, and dimensioned to confine a mode of a third wavelength $\lambda 3$ to be emitted/received by the phased array, larger than the wavelengths to be confined in waveguides 106 and 108, in an exemplary embodiment where the phased array according to the present disclosure is provided for emitting or receiving three distinct wavelengths $\lambda 1$, $\lambda 2$, $\lambda 3$. As illustrated in FIG. 8, the cross-section of waveguides 106, 108 and 110 has a stepped pyramid structure of increasingly higher refractive index that pushes the shorter wavelength light into the upper portions of the pyramid. On another hand, because waveguides 106, 108 and 110 are dimensioned to confine modes respectively of wavelengths $\lambda 1$, $\lambda 2$, $\lambda 3$, light having wavelengths $\lambda 2$, $\lambda 3$ stay away from waveguide 106 and light of wavelength $\lambda 3$ stays away from waveguide 108. According to an embodiment of the present disclosure, $\lambda 1$, $\lambda 2$, $\lambda 3$ can be chosen in the 1.4-2.2 µm SWIR, 3.0-4.2 µm MWIR1, 4.3-5.0 µm MWIR2 and 8.0-12.0 µm LWIR bands. Additional waveguides can be provided for handling more than three wavelengths.

According to an embodiment of the present invention, one or more of waveguides 106, 108 and 110 can comprise a plurality of layers of same or different refractive index and of same or decreasing width. In FIG. 8, waveguide 110 comprises a waveguide 112 coupled on top of a wider waveguide 114.

According to an embodiment of the present disclosure, each of waveguides 106, 108 and 110 comprises at least one undoped or unintentionally doped layer 116, 118, 120 of an electro-optic material. The waveguides can then comprise layers 122, 124, 126 of N or P-doped materials arranged so as to form the P or N portions of back to back connected PIN diodes having undoped or unintentionally doped layers 116, 118, 120 as their I portions. In FIG. 8, waveguide 106 only comprises layer 116 but a narrow layer of P or N doped material 127 is coupled on top of layer 116 to form a PIN diode with layer 116 and P or N doped layer 122 of waveguide 108. Control electrodes 128, 130, 132, 134 are coupled to the layers of N-doped or P-doped materials to bias the PIN diodes.

The I-layers 116, 118, 120 preferably have low background carrier concentration so that they can be depleted of free carriers by applying a small reverse bias voltage to their associated PIN diode. Changing the bias voltage applied across an I-layer changes the optical refractive index of its electro-optic material. The change in the phase shift of the light is proportional to $\Delta n \cdot L / \lambda$, where $\Delta n$ is the refractive index change, L is the length of the phase shifter and $\lambda$ is the optical wavelength. Changing the voltage applied across the control electrodes 134 and 132 will change the phase shift of the $\lambda 1$ light (e.g. SWIR light); changing the voltage applied across electrodes 132 and 130 will change the phase shift of the $\lambda 2$ light (e.g. MWIR light); and changing the voltage applied across electrodes 130 and 128 will change the phase shift of the $\lambda 3$ light (e.g. LWIR light). The voltage results in an electric field applied to the electro-optic material, whose refractive index is affected by the electric field.

According to an embodiment of the present disclosure, the waveguides can be fabricated from an III-V semiconductor material system such as GaAs/GaAlAs, GaInAlAs/InAlAs/InP, or GaInAsP/InP that provides a variety of materials that have different optical refractive index but that have the same lattice constant.

According to an embodiment of the present disclosure, input waveguide 96 and intermediary S-shaped waveguides 104 can have the same structure as phase shifter 92, without electrodes.

FIG. 9 is a cross section of a coupler 95 of amplitude adjusting section 94. Coupler 95 can be described as two phase-shifters 92 coupled laterally to each other in a coupling portion, such that the coupled waveguides 106 of the two phase-shifters 92 form a wider waveguide 206; the coupled waveguides 108 of the two phase-shifters 92 form a wider waveguide 208; and the coupled waveguides 110 of the two phase-shifters 92 form a wider waveguide 210. The waveguides 206, 208, 210 are arranged consistently with waveguides 106, 108, 110 to form PIN diodes. According to an embodiment of the present disclosure, the PIN diodes comprising waveguides 206, 208, 210 have each a left side and a right side, that are respectively coupled to control electrode pairs 128L-130L, 130L-132L, 132L-134L and 128R-130R, 130R-132R, 132R-134R.

According to an embodiment of the present disclosure, controlling differently the voltage applied to the left and right electrode pairs allow controllably directing for each wavelength $\lambda 1$, $\lambda 2$, $\lambda 3$ the light received by the coupling portion toward the left or right waveguide portion that comes out of the coupling portion.

According to an embodiment of the present disclosure, phase shifter 92 and coupler 95 can comprise thermo-optic materials instead of electo-optic materials, such as described in co-pending application Ser. No. 14/290,979, entitled: "MULTI-WAVELENGTH BAND OPTICAL PHASE AND AMPLITUDE CONTROLLER".

Figure 10:
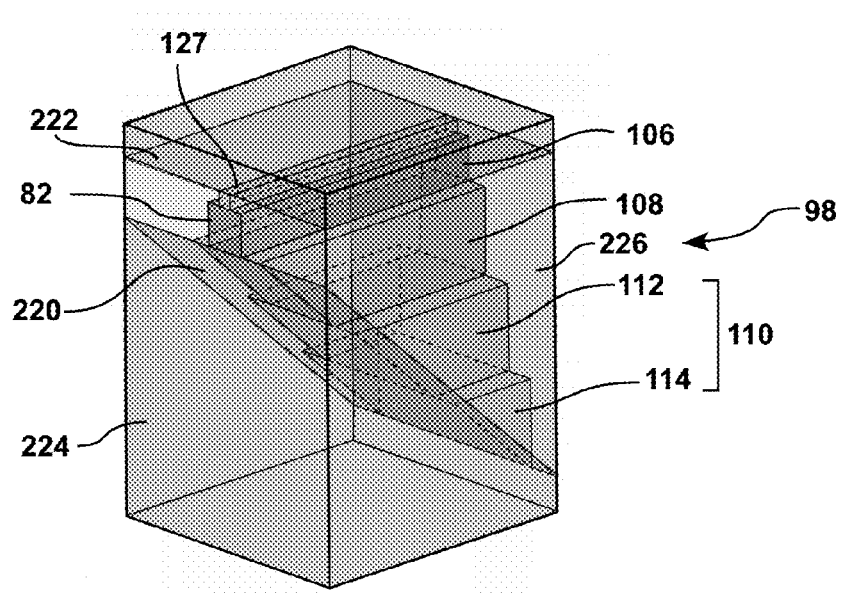
FIG. 10 is an elevation view of a portion of an emitter as illustrated in FIG. 7.

FIG. 10 is an elevation view of a waveguide taper 98 coupled between an intermediary waveguide 104, having stacked waveguides 106, 108 and 110 of increasing width, and an optical emitter/receiver element 82 according to an embodiment of the present disclosure. Optical emitter/receiver element 82 comprises the intersection of top waveguide 106 and the emitter side of chip 90. Taper 98 comprises a bottom metal wall 220 that starts below the bottom waveguide 110, away from optical emitter/receiver element 82, and climbs at an angle toward the intersection of the bottom edge of waveguide 106 and the emitter side of chip 90. According to an embodiment of the present disclosure, taper 98 comprises a top metal wall 202 located in chip 90 above waveguide 106. In the exemplary embodiment of FIG. 10, top metal wall 222 is parallel to waveguide 106 and above narrow layer 127. According to an embodiment of the present disclosure, taper 98 comprises left and right metal walls 224, 226 located in chip 90 on the sides of waveguide 106. In the exemplary embodiment of FIG. 10, lateral metal walls 224, 226 are vertical and parallel, and distant of a distance larger than the width of waveguide 110. Alternatively, metal walls 222, 224, 226 can also converge with an angle toward optical emitter/receiver element 82.

Figure 11:
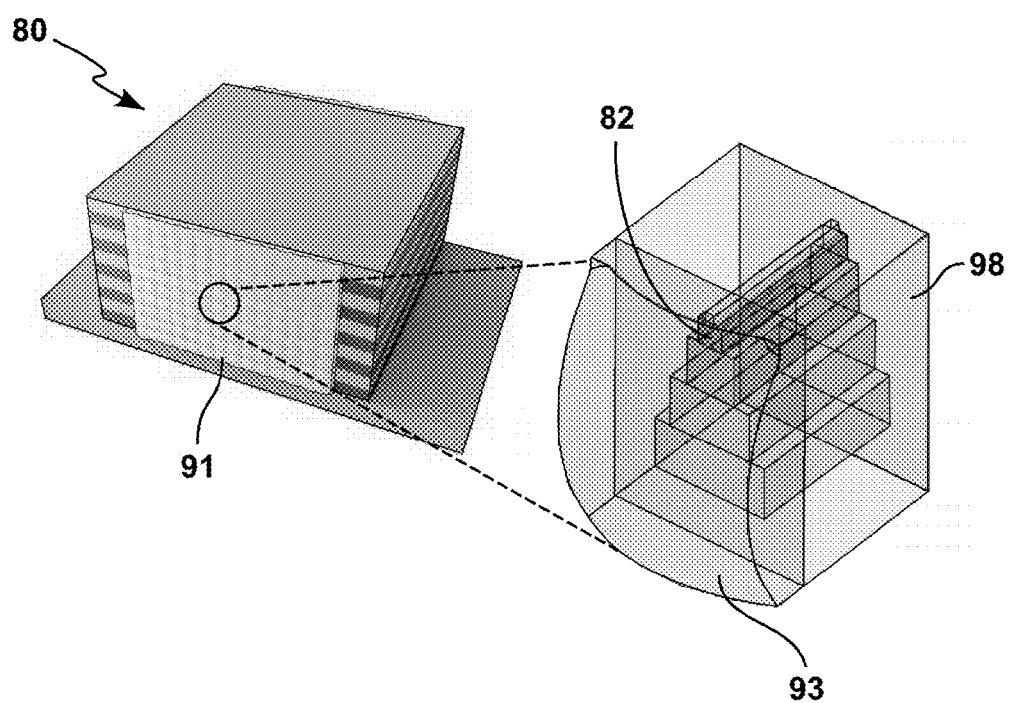
FIG. 11 is an elevation view of an emitter as illustrated in FIG. 7, showing the position of the emitter in an elevation view of an optical phased array comprised of portions such as shown in FIG. 6A.

FIG. 11 shows lens 93 coupled in front of optical emitter/receiver element 82 of FIG. 10. According to an embodiment of the present disclosure, lens 93 can be conformal to the surface of the emitter side of chip 90. According to an embodiment of the present disclosure, the combination of a surface conformal bi-dimensional microlens 93 and compact metal-walled taper 98 allows reducing the effective emitter sizes for each spectral band and achieves radiation-element limited beam divergence >120° for all wavelengths. As outlined above, waveguide taper 98 has a metal wall on all 4 sides of the waveguide, and is designed to compress the size of the λ2 and λ3 optical modes in order to increase the divergence of the λ2 and λ3 light emitted at the end of the waveguide. At the longer wavelengths λ2 and λ3, insertion loss from metal absorption is tolerable. At the start of the taper 98, the walls are located far from each other and sufficiently far from the stepped pyramid structure that the λ2 and λ3 optical modes have negligible overlap with those walls. The walls 220, 222, 224, 226 are then moved gradually closer to each other as the taper progresses. The wall 220 on the side near the bottom of the stacked pyramid is moved more rapidly than the wall 222 on the side near the top of the pyramid. The walls 224, 226 on the sides of the pyramids are moved toward each other in a more symmetric manner in some embodiments; but the walls 224, 226 can be moved toward each other in an asymmetric manner in other embodiments. At the end of the taper, the 4 walls are preferably centered on the axis of the λ1 optical mode, near the top of the pyramid structure. The metal-walled taper is intended to have a strong effect on the λ2 and λ3 modes but only minimal effect on the λ1 mode.

Simulations indicate that an exemplary taper having a 2 μm width and height can achieve an emitter-determined 3-dB beamwidth of 129° for 9 μm wavelength light, compared to a beamwidth of only 42° for a waveguide without a taper. More than 90% of the 9 μm wavelength light is transmitted through that taper. For a SWIR λ1 light, whose mode size already is smaller than the 2 μm width and height of the output end of the taper, the taper has only a minimal effect. Besides compressing the optical modes of a λ3 LWIR and a λ2 MWIR2 light, the taper also moves the location of the LWIR and MWIR2 modes so that all 3 wavelength bands are emitted from the same region, the end of waveguide 106, surrounded by the walls of the taper 98. Although the figure only depicts a taper along the y-axis, there can also be a taper along the x-axis, as discussed above. The material of the metal walls is selected to minimize the absorption loss from the metal. For most wavelengths, silver (Ag) is a suitable low-loss material for the walls of the taper.

According to an embodiment of the present disclosure, the metal-walled taper 98 also provides optical isolation between adjacent emitters 82, permitting those emitters to be spaced as closely as 2.5 μm apart in the lateral direction (i.e., along the x axis). The emitter spacing along the y axis is not limited by the size of the end of the metal-walled taper but rather by the size of the taper at the beginning of that structure. Thus, the emitter spacing along the y axis generally is at least 10-15 m.

According to an embodiment of the present disclosure, lens or microlens 93 coupled to emitter 82 functions to enlarge the element-determined beam width of the λ1 light (e.g. SWIR light or MWIR1 light) and also somewhat enlarge the beam width of the λ2 light (e.g. MWIR2 light). There is one microlens associated with each metal-walled waveguide taper, and with each emitter aperture. For example, the lens 93 can be a divergent lens having a concave curvature and sub-focal-length spacing between the lens surface and the end of the metal-walled waveguide taper 98 that are designed to efficiently achieve the desired wide element pattern for the λ1 (e.g. SWIR) light. The axis of the microlens 93 can be aligned with the common axis of the λ1, λ2, λ3 (SWIR, MWIR1, MWIR2 and LWIR) modes at the end of the taper 98.

According to an embodiment of the present disclosure, the size of microlens 93 and the distance between its curved surface and the taper end generally is too small for the microlens to significantly affect the element-determined beam width for the λ3 (LWIR) light. Thus, microlens 93 affects primarily the λ1 (SWIR or MWIR1) lights and also affects, to some extent, the λ2 (MWIR2) light. The region between the taper end and the lens surface can be filled with a semiconductor material whose refractive index is similar to that for the material of the multi-band optical waveguide. Microlens arrays formed in materials such as GaAs and Si are available from commercial suppliers. The microlens array can be accurately aligned and attached to the multi-slice stack with a flip-chip bonder.

The design of an optical phased array is critical to enable scanning of its output beam over a large field of regard without producing grating lobes. Periodic arrays have grating lobes at angles $\theta_{gl}$ given by $$\sin(\theta_{gl}) - \sin(\theta) = \frac{n\lambda}{d}$$

where θ is the scan angle, n is an integer, λ is the wavelength, and d is the array spacing. Typical RF phased arrays have element spacing on the order of λ/2, which enables scanning over a 180° field of regard without the formation of grating lobes. In the optical regime, however, it is difficult to fabricate an array having such a small element-spacing, especially for phased arrays that operate overall multiple wavelength bands.

According to an embodiment of the present disclosure, grating lobes do not occur when there is no periodicity of the emitter elements, and if the elements are placed at random locations, the radiation can be analyzed as being coherent in the main beam, and incoherent away from the main beam. The intensity in the main beam varies as $N^2$, and the expected value of the intensity at other angles varies as N, where N is the number of elements in the phased array. Therefore, the average sidelobe level is proportional to 1/N. The peak sidelobe level is higher, but also decreases as N increases. According to an embodiment of the present disclosure, a phased array having pseudo-randomly positioned emitter elements is designed following the two following additional guidelines: 1) the shapes of the main beam and the nearby sidelobes are not significantly affected by randomization of the element spacing, and 2) the distant sidelobe structure is dominated by the degree of randomization. As a result, beam steering angles have only a minor influence on the sidelobe levels of the array output.

According to an embodiment of the present disclosure, the approximate value for the minimum number of elements, along an axis, for which the general theory governing pseudo-random array design holds is about 15-20 elements.

According to an embodiment of the present disclosure, the first sidelobes away from the main beam are "coherent" and can be eliminated by tapering the emission intensity distribution across the aperture, if this is required for a particular application. This intensity taper does not lower the level of the "random" sidelobes of the non-uniform array however. One way to accomplish this aperture intensity taper is to vary the element density as a function of position in the array aperture.

According to an embodiment of the present disclosure, a two-axis pseudo-random spacing arrays can be constructed and analyzed as rows (or slices) of emitting elements. The elements in each row have pseudo-random spacing, where the spacing in a given row can be different from the spacing in other rows. Also, the spacing between the rows is pseudo-random. The degree of randomization in such an array is more limited than the randomization in arrays that are not constructed as combination of rows and thus have complete two-dimensional randomization. Features of a method and corresponding software for such construction and analysis are described below.

For the construction of the spatial locations of the array elements, the following inputs are specified by the user:

The desired aperture dimensions.

The minimum and maximum spacing allowed between any two elements along X axis.

The minimum and maximum spacing allowed between any two rows along Y axis.

Whether or not additional element-density tapering from the aperture center to the aperture edges will be introduced. Tapering reduces the number of elements for a fixed aperture dimension at the expense of increased average sidelobe levels and broadening of the main beam. The minimum beamwidth achievable for a given aperture (excluding super-directivity) is the non-tapered aperture. Recall that for pseudo-random arrays the average sidelobe level is inversely proportional to the number of array elements. In general, arrays with element-intensity tapering will achieve better directivity than their less dense element-density tapered array alternatives.

The method/software constructs a two-axis pseudo-random array based on the following procedure:

First, determine the Y locations of the rows as follows:

Generate the inter-row offsets in Y (i.e., the center-to-center spacing from one row of the array to its adjacent row) using a random number generator with a uniform distribution between the user-specified minimum and maximum Y spacing values.

Start at one end of the array and place the rows based on the list of generated offsets.

Some rows will lie beyond the extent of the aperture; remove all rows that lie outside the aperture.

Center the set of rows so that the rows at the two edges are located at the same distance from the edges of the aperture.

Second, for each row, determine the X locations of the elements in that row as follows. This step will be performed $N_y$ times, where $N_y$ is the number of rows:

Generate a set of inter-element offsets in X (i.e., the center-to-center spacing from one element of the row to its adjacent element) using a random number generator with a uniform distribution between the user-specified minimum and maximum X spacing values.

Start at one end of the row and place the elements based on the list of generated offsets.

Some elements will lie beyond the extent of the aperture; remove all elements that lie outside the aperture.

Center the set of elements so that the elements at the two edges are located at the same distance from the edges of the aperture.

If density tapering is desired, then thin the array as follows:

Create a probability distribution (probability of exceeding a threshold value) that varies over the two-dimensional aperture in the same way as the desired taper.

Generate a random number for each element and compare that number with the threshold value.

If the random number assigned to an element exceeds the threshold value, keep that element; otherwise, discard the element.

For the assignment of the amplitude and phase settings for each of the array elements, the following inputs are specified by the user:

Wavelengths of operation.

Number of beams formed simultaneously.

Far-field angles at which those beam are directed.

Number of bits used for phase shifting and amplitude control.

Once the pseudo-random array has been generated, the software calculates the excitation pattern (i.e., the amplitude and phase of each element) of the elements in the array that will generate beams that point in each of the desired beam angles. The specific angles at which the beams to be formed are pointed are determined by considering the Array Factor, AF, which describes the interference between the multiple elements of the array. In spherical coordinates, the Array Factor can be described as:

$$AF_{\theta,\phi} = \Sigma_n a_n e^{j\phi_n} \exp\{jk_o[x_n(\sin\theta\cos\phi) + y_n(\sin\theta\sin\phi)]\}$$

This expression includes the contributions of the amplitude $a_n$ and phase n of each emitter, which has the location $(x_n, y_n)$ on the aperture plane ($\theta = \pi/2$). The beam is pointed at the angular direction $(\theta_o, \phi_o)$.

When only a single beam is formed, the amplitude weights $a_n$ can be set equal to 1. The phase weight n for an emitter is determined from the following expression:

$$\phi_n = k_o(x_n \sin\theta_o \cos\phi_o + y_n \sin\theta_o \sin\phi_o)$$

Multiple beams are achieved through the linearity of radiation. For example, let $w_1$ be the complex weights (amplitude and phase) that produce beam 1 (i.e., the vector $a_n e^{j\phi_n}$), and $w_2$ be the complex weights that produce beam 2. Both beams 1 and 2 are produced by exciting the array with weights ($w_1+w_2$). Formation of more than one beam requires amplitude control for each element because of the interference of $w_1$ and $w_2$. If the amplitude weights for each of the two beams are set to 1, the summation of the two complex weights gives another complex weight whose amplitude can vary between 0 and 2, depending on the values of the phase weights of the two beams.

The array radiation pattern is a composite of the Element Factor, which is the radiation pattern of an element of the array, and the Array Factor, which describes the interference between the multiple elements of the array [Balanis]. Once the appropriate phase and amplitude control settings for creating the desired pattern of a single beam or multiple beams are determined for each element of the array and for each wavelength, the Array Factor can be calculated. The Array Factor provides a good indication of the beam widths and the sidelobe level. The Array Factor is normalized by setting the total emitted power to N, where N is the number of elements in the array. The Element Factor can subsequently be multiplied by the Array Factor to generate the overall radiation pattern of the pseudo-random beam former output.

The Element Factor is estimated by assuming that each array element emits a Gaussian beam with waist $w_o$ given by (1) with polarization in the x-y plane.

$$I(\rho, z) = I_0 \left(\frac{w_0}{w(z)}\right)^2 e^{-2\rho^2/w^2(z)} \quad (1)$$

where $w_0$ is the beam waist at z=0 and w(z) is the beam width for z>0 that grows by the beam divergence angle θ given by $$\tan\theta = \frac{\lambda}{\pi w_0} = \frac{4\lambda}{\pi a} \quad (2)$$

where λ is the wavelength and a is the effective diameter of the circular emitter. Equation (1) is in cylindrical coordinates and relies on the paraxial approximation; i.e., that z>>ρ, or alternatively, that θ is small. However, we need to know the far-field radiation pattern as a function of angles, and in addition, at angles up to 90° from the z axis. In addition, the polarization of the aperture field significantly affects the magnitude of the radiation at angles above 30° from the z axis.

To determine the interaction between multiple emitters in a phased array, we use the electric field amplitude, which is simply the square root of (1)

$$F(\rho, z) = F_0 \left(\frac{w_0}{w(z)}\right) e^{-\rho^2/w^2(z)} \quad (3)$$

The electric field at the beam waist $w_0$ is given by $$E' = (E_{0x}\hat{x} + E_{0y}\hat{y})e^{-(x^2+y^2)/w_0^2} = E_0 f(x',y') \quad (4)$$

where x' and y' are the coordinates of the radiating field in the z=0 plane, $\hat{x}$ and $\hat{y}$ are unit vectors in the x and y directions, respectively. $E_{0x}$ and $E_{0y}$ are the electric field magnitudes at the origin in the x and y directions, respectively. E' represents both the magnitude and the polarization of the electric field.

Far field radiation is calculated from the fields in the z=0 plane using Huygen's Principle; this derivation directly follows [Balanis]. The electric field given by (4) is equivalent to a magnetic current on the entire z=0 plane $$M = (M_x\hat{x} + M_y\hat{y}) = -2\hat{z} \times E' = 2(E_{0y}\hat{x} - E_{0x}\hat{y})f(x',y') \quad (5)$$

Next, the electric vector potential is calculated, from which the far-field electric field is calculated. This step has been tabulated in [Balanis], and only the relevant quantities are presented here. In spherical coordinates, the far-field electric field components are given by $$E_\theta = -\frac{jk}{4\pi} \frac{e^{-jkr}}{r} \int\int (-M_x\sin\phi + M_y\cos\phi)e^{jk_x x'} e^{jk_y y'} dx'dy' \quad (6)$$

$$E_\phi = \frac{jk}{4\pi} \frac{e^{-jkr}}{r} \int\int (M_x\cos\theta\cos\phi + M_y\cos\theta\sin\phi)e^{jk_x x'} e^{jk_y y'} dx'dy' \quad (6b)$$

where $$k_x = k \sin\theta \cos\phi \quad (7a)$$

$$k_y = k \sin\theta \sin\phi \quad (7b)$$

are the x and y components of the propagation vector from the origin to observation angle. For the far field pattern, we do not need the absolute phase (which is accounted for in the Array Factor), and the 1/r dependence is typically accounted for in a link budget, not the radiation pattern.

The element pattern can be calculated as $$F_\theta = \frac{r}{e^{-jkr}} E_\theta = -\frac{jk}{2\pi}(-E_{0y}\sin\phi - E_{0x}\cos\phi)\tilde{f}(k_x, k_y) \quad (8a)$$

$$F_\phi = \frac{r}{e^{-jkr}} E_\phi = \frac{jk}{2\pi}(E_{0y}\cos\theta\cos\phi - E_{0x}\cos\theta\sin\phi)\tilde{f}(k_x, k_y) \quad (8b)$$

where $$\tilde{f}(k_x,k_y) = \iint e^{-(x^2+y^2)/w_0^2} e^{jk_x x'} e^{jk_y y'} dx'dy' = \pi w_0^2 e^{-w_0^2(k_x^2+k_y^2)/4} \quad (9)$$

is the two-dimensional Fourier transform of the aperture distribution f(x',y') into the spectral domain. Using (7)

$$\tilde{f}(k_x,k_y) = \pi w_0^2 e^{-[(kw_0 \sin\theta)/2]^2} \quad (10)$$

and finally $$F_\theta = \frac{jkw_0^2}{2} e^{-[(kw_0\sin\theta)/2]^2} (E_{0y}\sin\phi + E_{0x}\cos\phi) \quad (11a)$$

$$F_\phi = \frac{jkw_0^2}{2} e^{-[(kw_0\sin\theta)/2]^2} (E_{0y}\cos\theta\cos\phi - E_{0x}\cos\theta\sin\phi) \quad (11b)$$

the scalar magnitude is given by $|F| = \sqrt{|F_\theta|^2 + |F_\phi|^2}$.

Phase errors affect the array gain, side-lobe level, and beam position. For quantization phase errors, the beam pointing error is approximated by [Mailloux]

$$\Delta \approx \frac{\pi}{4} \frac{1}{2^M} \text{ beamwidths}$$

where the aperture phase is controlled by M-bit phase shifters (i.e. the phase resolution is $2\pi/2^M$); sufficient accuracy is achieved by 4-bit phase shifters.

The phase quantization introduces periodic phase errors, which introduce grating lobes. The level of the lobes relative to the main beam is approximated by −6M dB [Balanis]. Therefore, at least 5-bit control is required to ensure sidelobes <−30 dB. The beam-pointing error and grating-lobes introduced by the phase quantization can be reduced by adding randomization to the quantized phase. On the other hand, if the phase errors are random, the beam pointing error is given by [Steinberg]

$$\Delta \approx \frac{\sqrt{3}}{\pi} \frac{\sigma_\phi}{\sqrt{N}} \text{ beamwidths},$$

which is negligible for N>10. The sidelobes are increased in the periodic array, but the increase is negligible for the large pseudo-random array, even up to phase errors of ±π/4

(uniform distribution). The array gain, however, drops as the phase error increases because the radiation in the main beam is less coherent.

According to an embodiment of the present disclosure, the beam patterns that can be formed by the optical phased array beam former depend on physical parameters such as the number of emitter elements, the spacing between and spatial pattern of those elements, and the overall size of the bi-dimensional array aperture. Beam pattern characteristics include the far-field angle in which a beam is directed, the width and peak intensity of a main beam, the average sidelobe intensity, the fractional power on target, and the beam efficiency (total power in the one or more main beams normalized by the total emitted power). We define the fractional power on target as the power at beam center, over a 1 mrad wide solid angle, normalized by the total power emitted by the array. FIGS. 13-22 show examples of beam patterns produced by optical phased arrays that have 2-axis pseudo-randomly-spaced emitters. The beam patterns were calculated using a simulation software for pseudo-randomly-spaced arrays, as described above.

Figure 12A:
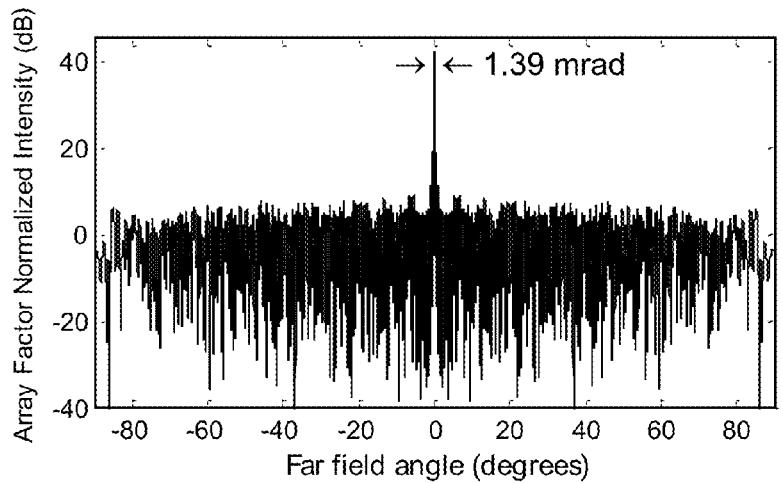
FIGS. 12A, 12B and 12C illustrate far-field beam patterns produced by a phased array according to an embodiment of the present disclosure.
Figure 12B:
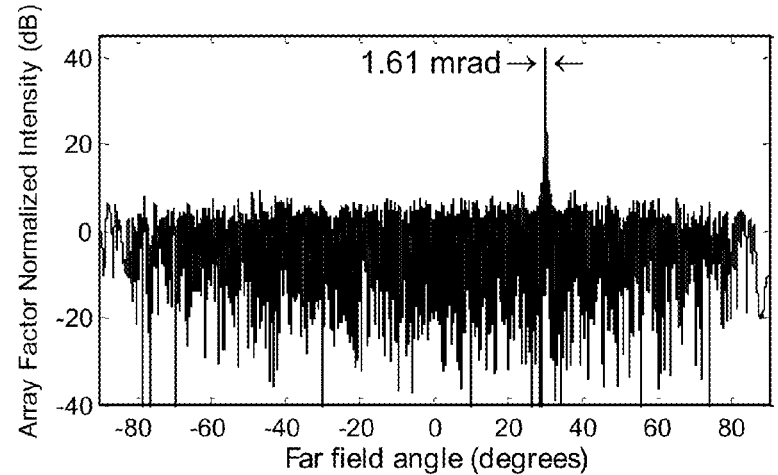
Figure 12C:
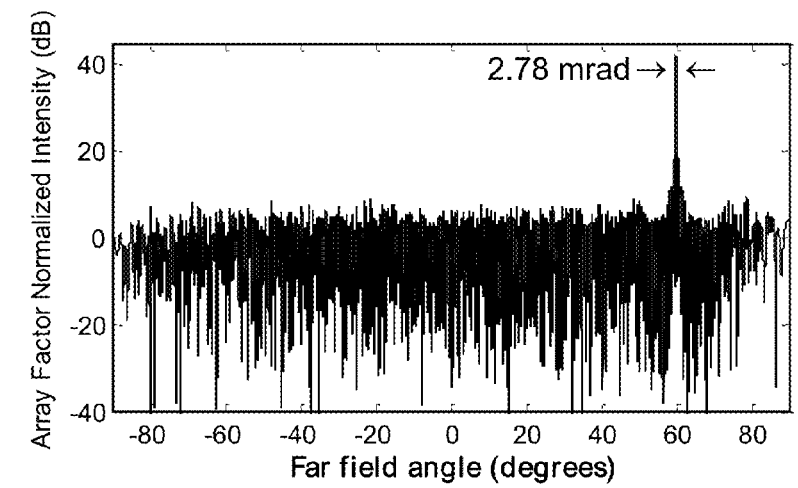
Figure 13A:
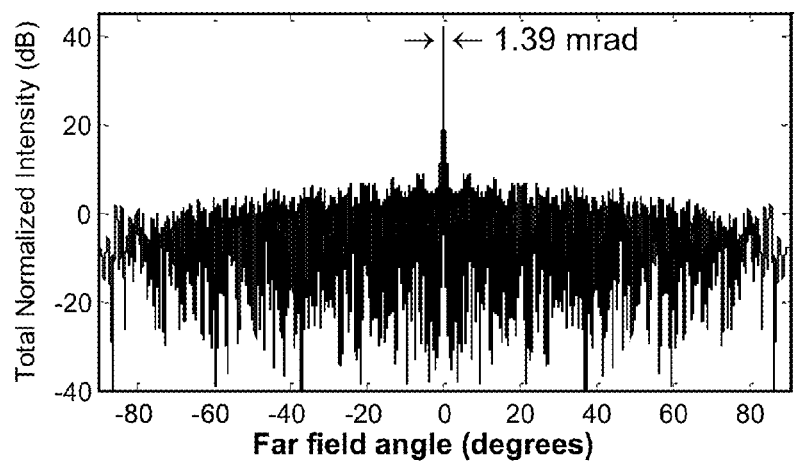
FIGS. 13A, 13B and 13C illustrate far-field beam patterns produced by a phased array according to an embodiment of the present disclosure.
Figure 13B:
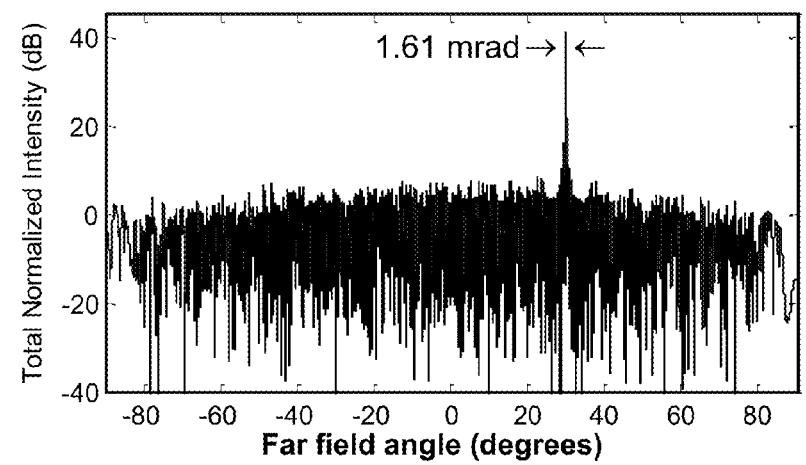
Figure 13C:
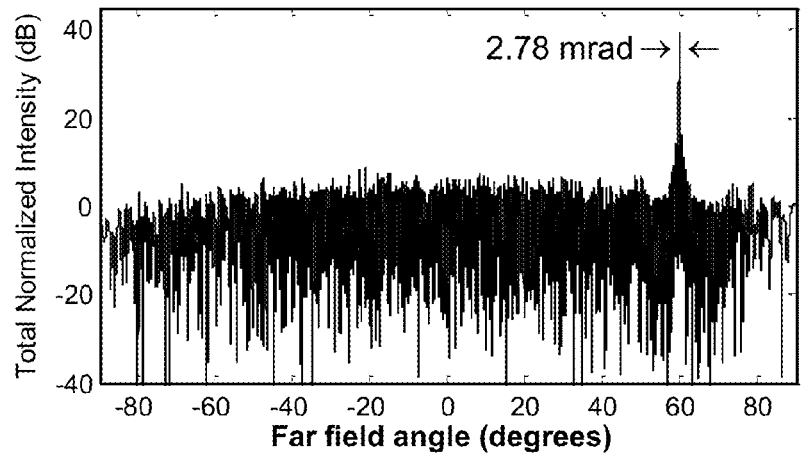

FIGS. 12A to 12C and 13A to 13C illustrate the effects of the element pattern (or Element Factor) and the Array Factor on the net far-field beam pattern produced by the phased array. FIG. 12A shows the beam pattern of a 10 mm×10 mm phased array according to an embodiment of the present disclosure for one beam at 10 μm wavelength steered at an angle θ, along the x-z plane, of 0°. FIGS. 12B and 12C show the beam pattern for the same phased array for the beam steered at an angle θ of 20° and 60°, respectively. Compared to the beam pointed at 0°, the divergence of a beam pointed at 60° is greater by a factor of 2. FIGS. 13A to 13C show that the maximum power is reduced by a factor of 2, for the same wavelength, when an emitter-element pattern is chosen whose full-width at half-maximum value is 120°. For this exemplary bi-dimensional array, an overall taper in the emitter-element distribution was not used. Since only one beam is formed, in this example, all emitters emit light of the same amplitude but the phase of the light emitted from each emitter was adjusted to achieve the desired pointing angle. For 10 μm wavelength light, this 10 mm×10 mm aperture array maintains <3 milli-radians beam-divergence angle (full width at $1/e^2$ from peak) for scan angles out to 60°.

Figure 14A:
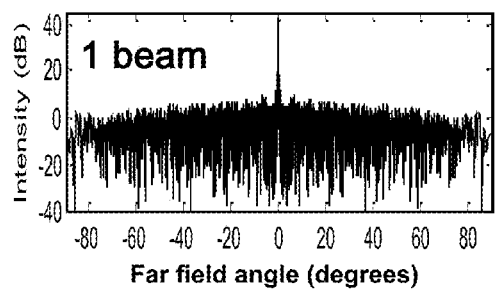
FIGS. 14A, 14B, 14C and 14D illustrate far-field beam patterns produced by a phased array according to an embodiment of the present disclosure emitting one to four beams.
Figure 14B:
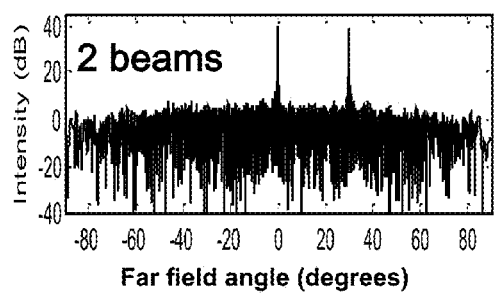
Figure 14C:
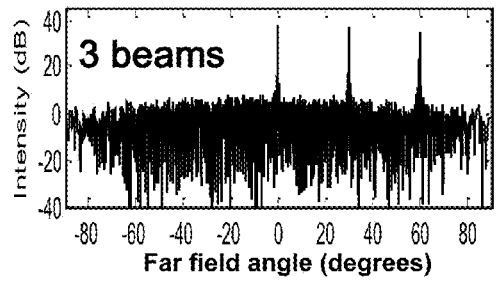
Figure 14D:
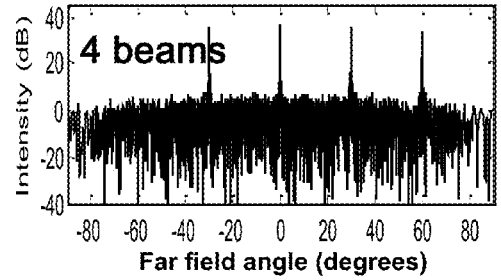

FIGS. 14A to 14 D illustrate the effect of increasing the number of simultaneous beams produced at a given wavelength by a phased array according to an embodiment of the present disclosure, with patterns containing 1 beam (FIG. 14A), 2 simultaneous beams (FIG. 14B), 3 simultaneous beams (FIG. 14C) and 4 simultaneous beams (FIG. 14D) for a 10 μm wavelength light pointed at angles comprised between 0° and 60°. In FIG. 14A the single beam is emitted at an angle of 0°; in FIG. 14B the two simultaneous beams are emitted at angles of 0 and 30°; in FIG. 14C the three simultaneous beams are emitted at angles of 0, 30 and 60°; and in FIG. 14D the four simultaneous beams are emitted at angles of −30, 0, 30 and 60°.

When multiple simultaneous beams are produced, the peak intensity of each beam is reduced correspondingly, since the emitted power is divided among those multiple beams. However, an embodiment of the present disclosure allows suitably controlling the magnitude of the light from the individual emitters, whereby the average sidelobe level obtained when multiple beams are produced is the same as the average sidelobe level obtained when a single beam is produced, as indicated by a comparison of the sidelobe levels shown in the far field patterns of FIGS. 14A-D. The figures also show that the average sidelobe energy, and thus the net beam efficiency resulting from the power in all of the main beams, can remain unchanged as a beam is scanned from broadside to 60° angle and as the number of simultaneous beams produced increases from 1 to 4.

The effect of splitting the light of a given wavelength among multiple simultaneous beams also is illustrated in the far-field pattern shown in FIGS. 5B to 5F. For this example, the phased array produces two main beams and no grating lobes. The beam at 60° steering angle has 1.5 and 4 μm wavelength light and the beam at 20° steering angle has 4 and 10 μm wavelength light. The element factors for all 3 wavelengths are designed to have a 120° full width at half maximum value, leading to a 3 dB drop in the peak intensity values at the 60° steering angle. Equal power is supplied at all 3 wavelengths to the beam former and the beam former is assumed to have zero excess loss. The far-field pattern shows that the power of each beam at 4 μm wavelength is reduced by 3 dB, compared to the power at the other two wavelengths, since that light is divided among two simultaneous beams.

Figure 15C:
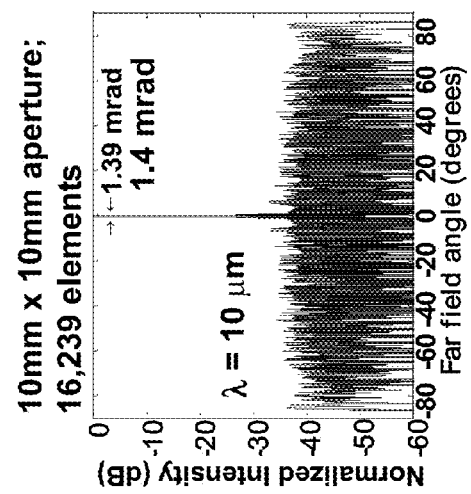
FIGS. 15A, 15B, and 15C illustrate far-field beam patterns produced by phased arrays according to embodiments of the present disclosure with and without emitter density taper.
Figure 15B:
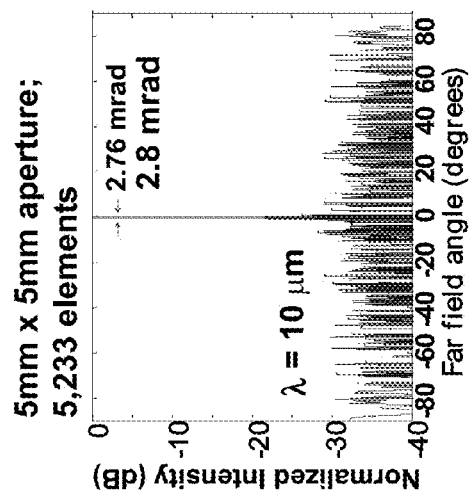
Figure 15A:
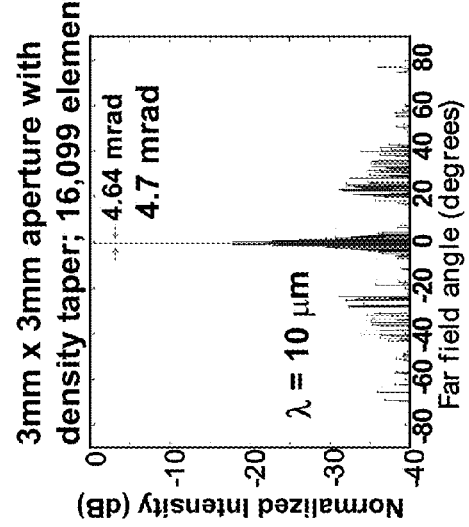

FIGS. 15A to 15C compare the beam patterns produced by three different two-axis pseudo-random spacing phased arrays according to embodiments of the present disclosure, with all three beam patterns calculated for a 10 μm wavelength light. FIG. 15A shows a beam pattern for a 3 mm by 3 mm array with 16,099 emitter elements, which has a density taper so that more elements are located near the center of the array than near the edges of the array. FIG. 15B shows a beam pattern for a 5 mm by 5 mm array with 5,233 emitter elements, which has no density taper; and FIG. 15C shows a beam pattern for a 10 mm by 310 mm array with 16,099 emitter elements, which has no density taper.

The density taper reduces the effective size of the aperture. The beam width in FIG. 15A is of 4.7 mrad; the beam width in FIG. 15B is of 2.8 mrad; and the beam width in FIG. 15C is of 1.4 mrad. As shown in the figures, the width of the main beam depends on the effective size of the array, with a larger array producing a narrower beam. According to an embodiment of the present disclosure, the number of elements that an array has affects the sidelobe level but not the beam divergence. According to an embodiment of the present disclosure, peak sidelobe levels for the beam patterns shown in FIGS. 15A and 15C are approximately the same, but the peak sidelobe levels for the beam pattern shown in FIG. 15B (which has fewer elements) is higher. A density taper according to an embodiment of the present disclosure can greatly reduce the sidelobe energy at certain far-field angles, such as those fairly close to broadside (θ=0°).

FIGS. 16A to 16J show far-field beam patterns produced by phased arrays according to embodiments of the present disclosure with and without emitter density taper. As illustrated in FIGS. 16A to 16J, the sidelobe energy for a two-axis pseudo-random spacing phased array according to the present disclosure remains low over almost all aperture-plane angles (or "phi cuts") except near φ=90° (i.e., the y-z plane), for which the degree of element-spacing non-uniformity is not as high. Low sidelobes are obtained between φ=0° and φ=89°, since the emitter spacings for a given slice can be different from the emitter spacings for the other slices. According to an embodiment of the present disclosure, depending on the particular application, the fractional power on target (determined for a 1 mrad wide portion of the beam at its center) or the total beam efficiency (including the entire beam width) can be a more useful metric indicating the beam-forming performance of the array.

Figure 16A:
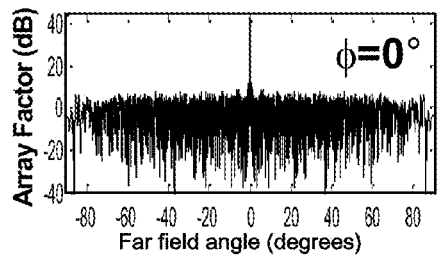
FIGS. 16A, 16B, 16C, 16D, 16E, 16F, 16G, 16H, 16I, 16J illustrate far-field beam patterns produced by phased arrays according to embodiments of the present disclosure with and without emitter density taper.
Figure 16B:
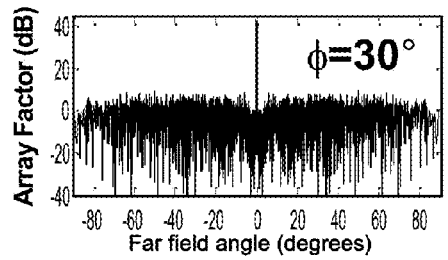
Figure 16C:
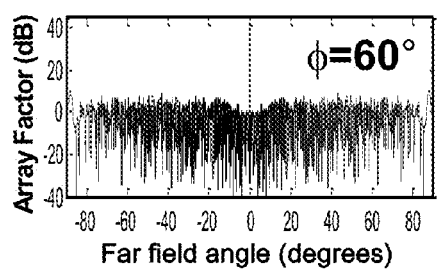
Figure 16D:
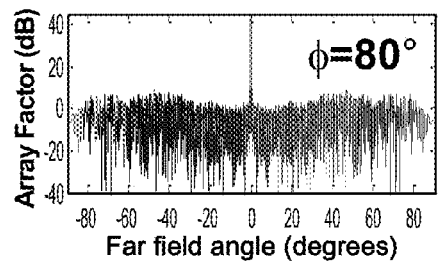
Figure 16E:
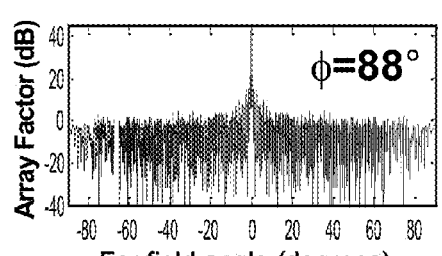
Figure 16F:
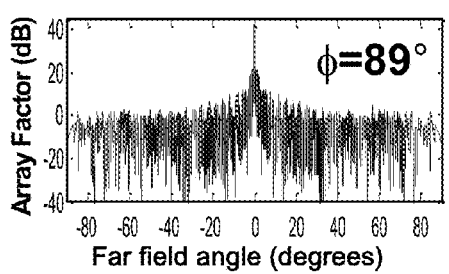
Figure 16G:
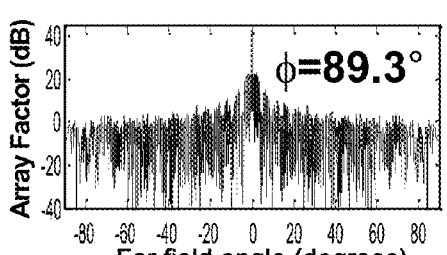
Figure 16H:
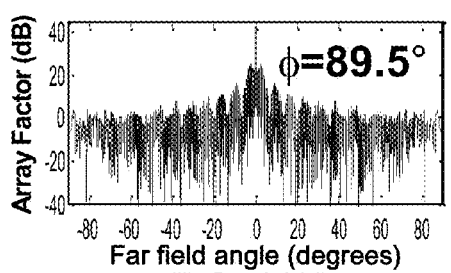
Figure 16I:
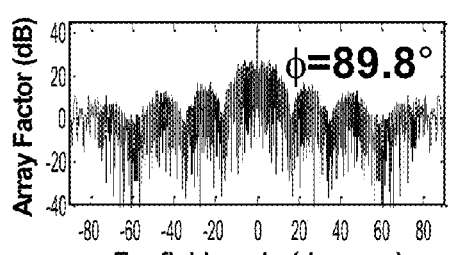
Figure 16J:
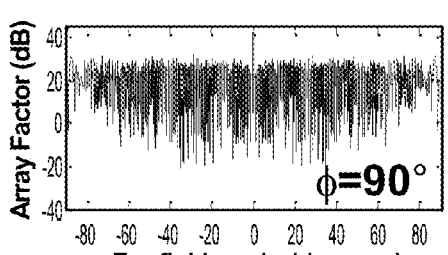
Figure 17A:
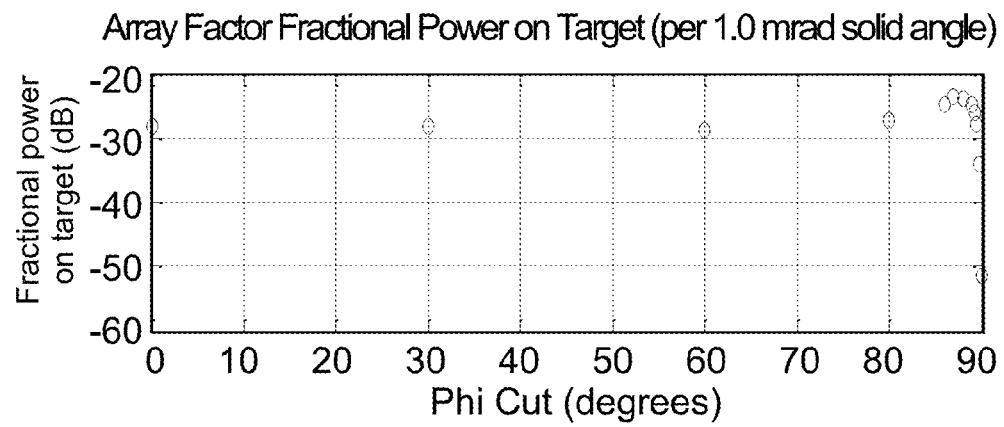
FIGS. 17A and 17B illustrate the fractional power on target and beam efficiency for different angles of steering for a phased array according to an embodiment of the present disclosure.
Figure 17B:
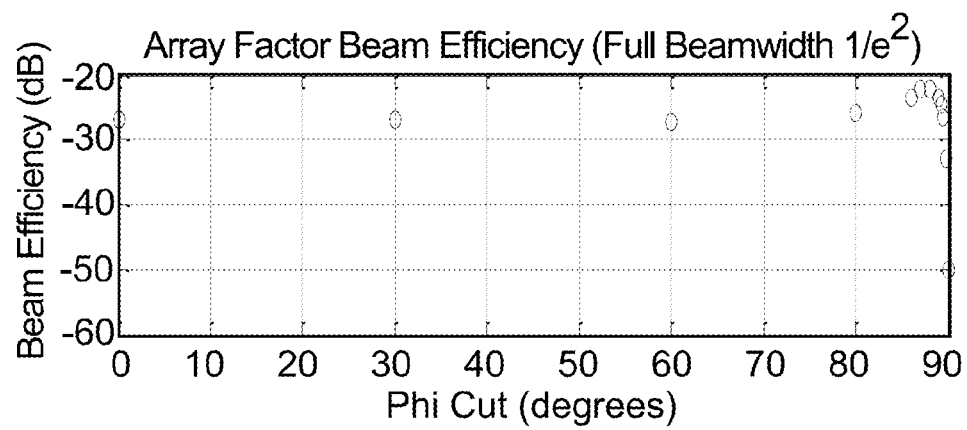

FIGS. 16A and 17B show the fractional power on target and beam efficiency for different angles of steering for a phased array according to an embodiment of the present disclosure. FIGS. 16A and 17 indicate that the values for the incremental fractional power on target and beam efficiency per cut in $\phi$ remain nearly constant over most values of $\phi$. The values for fractional power on target and beam efficiency are degraded significantly only when $\phi \geq 89.5°$. According to an embodiment of the present disclosure, when the element factor also is included, these efficiency values become even higher.

Figure 18A:
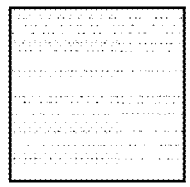
FIGS. 18A, 18B, and 18C illustrate three emitter patterns according to embodiments of the present disclosure.
Figure 18B:
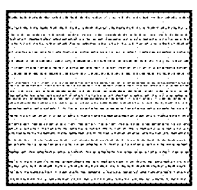
Figure 18C:
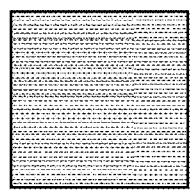
Figure 21A:
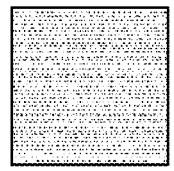
FIGS. 21A, 21B, 21C and 21D illustrate four emitter patterns according to embodiments of the present disclosure.
Figure 21B:
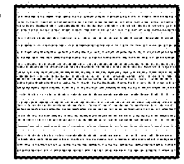
Figure 21C:
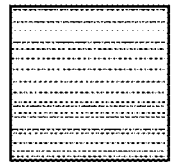
Figure 21D:
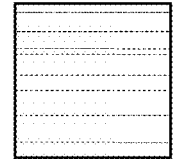
Figure 22A:
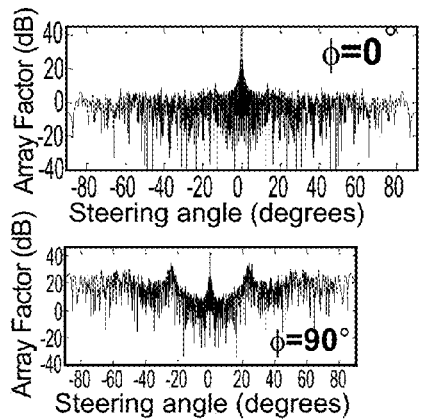
FIGS. 22A, 22B, 22C and 22D illustrate the fractional power on target and beam efficiency for different angles of steering for the phased arrays of FIGS. 21A, 21B, 21C and 21D.
Figure 22B:
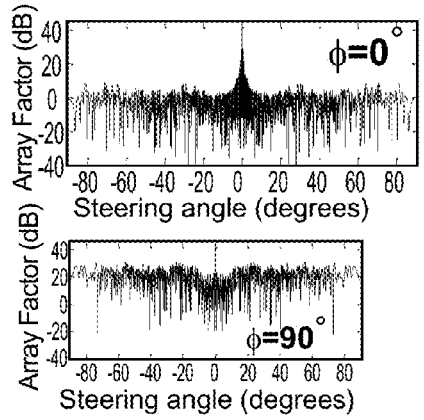
Figure 22C:
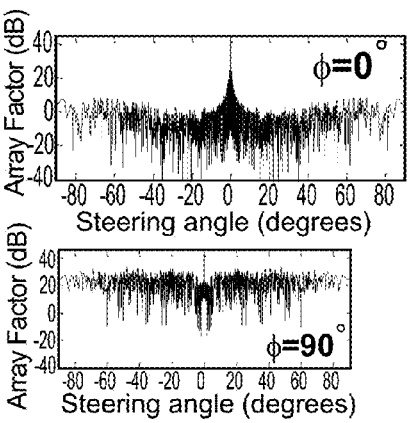
Figure 22D:
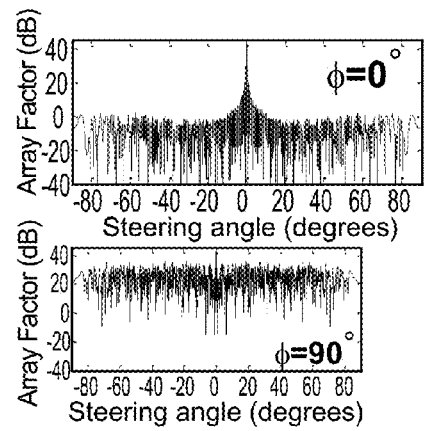

FIGS. 18A, 18B, and 18C illustrate three emitter patterns according to embodiments of the present disclosure, respectively for a 3 mm by 3 mm phased array having 3,847 elements arranged along 35 rows with an x spacing of 5 to 50 µm and a y spacing of 20 to 150 µm; for a 3 mm by 3 mm phased array having 16,021 elements arranged along 80 rows with an x spacing of 5 to 25 µm and a y spacing of 20 to 55 µm; and for a 3 mm by 3 mm phased array having 53,601 elements arranged along 125 rows with an x spacing of 5 to 9 µm and a y spacing of 20 to 28 µm. The three phased arrays are tested for a light having a 10 µm wavelength.

FIGS. 19A, 19B and 19C illustrate the fractional power on target and beam efficiency for different angles of steering for the phased arrays of FIGS. 18A, 18B, and 18C, respectively, and show that both the fractional power on target and beam efficiency increase as the number of array elements is increased (i.e., as the array is made less thin or sparse).

FIGS. 20A and 20B summarize the fractional power on target and beam efficiency per number of emitters for the phased arrays of FIGS. 18A, 18B, and 18C. FIGS. 20A and 20B were obtained after doing the scan-volume integration over all values of P between 0° and 90°. For the 3 mm×3 mm array with 53,601 elements and 10 µm wavelength light, the array-pattern beam efficiency is approximately −3 dB. For this array, the average spacing is approximately 13 µm, which is 1.3λ. In contrast, a "fully populated" array would have a spacing of only 0.5λ between elements, along both axes. The exemplary array with 53,601 elements has 125 rows, and approximately 429 elements per row (on average). For the three exemplary array configurations shown in FIGS. 18A-C, the arrays have 2.5-3.5 times more elements per row than number of rows. The scan-volume integrated efficiency values are higher when the ratio of element per row to number of rows is higher. Furthermore, the fractional power on target and the beam efficiency remain high for all aperture-plane angles except for values of $\phi$ between 89.5° and 90°.

FIGS. 21A, 21B, 21C and 21D illustrate four emitter patterns according to embodiments of the present disclosure, respectively for a 3 mm by 3 mm phased array having 15,998 elements arranged along 120 rows with an x spacing of 5 to 40 µm and a y spacing of 20 to 30 µm; for a 3 mm by 3 mm phased array having 16,021 elements arranged along 80 rows with an x spacing of 5 to 25 µm and a y spacing of 20 to 55 µm; for a 3 mm by 3 mm phased array having 16,495 elements arranged along 55 rows with an x spacing of 5 to 15 µm and a y spacing of 20 to 90 µm; and for a 3 mm by 3 mm phased array having 16,399 elements arranged along 30 rows with an x spacing of 2.5 to 8.5 µm and a y spacing of 20 to 180 µm. The four phased arrays are tested for a light having a 10 µm wavelength.

FIGS. 22A, 22B, 22C and 22D illustrate the fractional power on target and beam efficiency for 0° and 90° angles of steering for the phased arrays of FIGS. 21A, 21B, 21C and 21D. As shown on FIGS. 22A, 22B, 22C and 22D, the fractional power on target and the beam efficiency can be increased by reducing the number of stacked slices or rows in the bi-dimensional array while correspondingly increasing the number of emitters in each slice in order to maintain the same overall number of emitters.

Figure 23A:
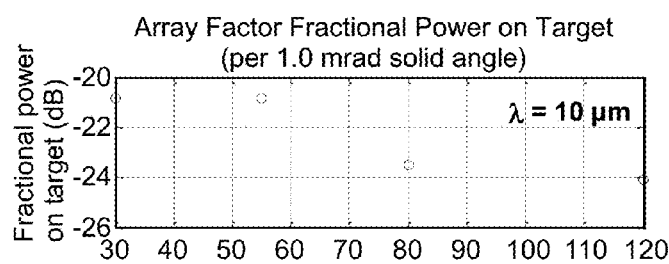
FIGS. 23A and 23B summarize the fractional power on target and beam efficiency per number of rows for the phased arrays of FIGS. 21A, 21B, 21C and 21D.
Figure 23B:
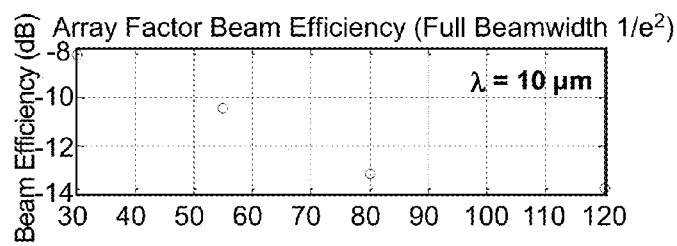

FIGS. 23A and 23B summarize the fractional power on target and beam efficiency per number of rows for the phased arrays of FIGS. 21A, 21B, 21C and 21D. The values for fractional power on target and beam efficiency shown in these figures consider only the Array Factor. Once the element pattern of the emitters is included, these values would be approximately 3 dB higher. By reducing the number of rows in the array (and slices in the beam former module) while maintaining the same overall number of emitters, the effective density of emitters is increased for all aperture-plane slices except those very close to $\phi=90°$. It has to be noted that the improvement achieved in the fractional power on target is only approximately 3 dB and the improvement in the beam efficiency is only approximately 6 dB. However, a significant benefit of using an array that has fewer rows of PR spaced elements is that fewer slices 90 of a 1D array of multi-band waveguide structures need to be assembled and stacked together.

FIGS. 24A, 24B, 24C, 24D and 24E illustrate the emitter patterns produced by a phased array according to an embodiment of the present disclosure, measuring 3 mm by 3 mm, having 16,021 elements arranged on 80 rows, with an x spacing of 5 to 25 µm and a y spacing of 20 to 55 µm for light of different wavelengths (1.5 µm, 3 µm, 5 µm, 7 µm and 10 µm). The main beam widths are respectively of 0.7 mrad; 1.4 mrad; 2.4 mrad; 3.3 mrad and 4.7 mrad. The beam patterns of FIGS. 24A, 24B, 24C, 24D and 24E show that for the longer wavelengths, the main beam is larger (since the overall size of the array compared to the wavelength is smaller) and the sidelobe energy is lower. According to an embodiment of the present disclosure, the reduced sidelobe energy occurs because for the longer wavelengths, which would have a larger spacing between its elements in a fully populated array, the pseudo-randomly spaced array is effectively less sparse.

Figure 24A:
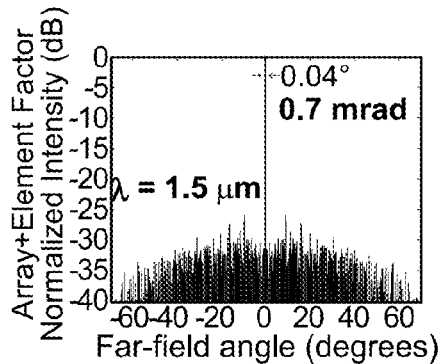
FIGS. 24A, 24B, 24C, 24D and 24E illustrate the emitter patterns produced by a phased array according to an embodiment of the present disclosure for light of different wavelengths.
Figure 24B:
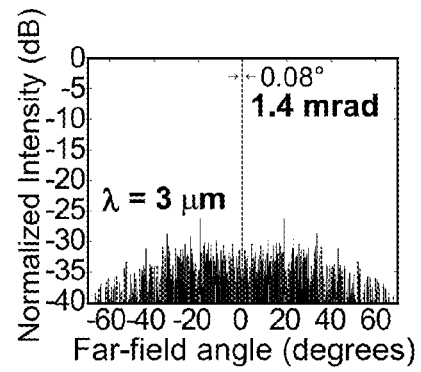
Figure 24C:
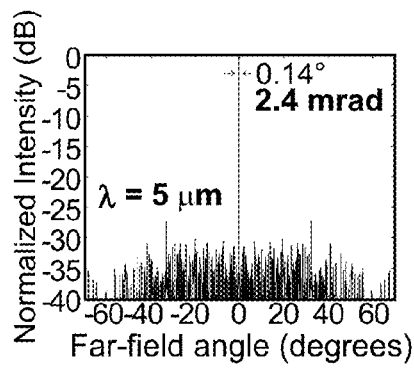
Figure 24D:
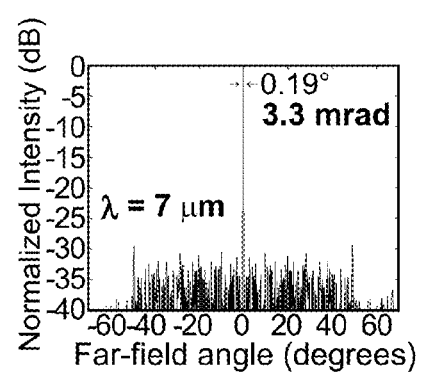
Figure 24E:
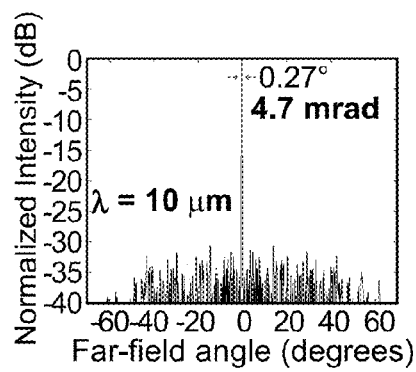
Figure 25A:
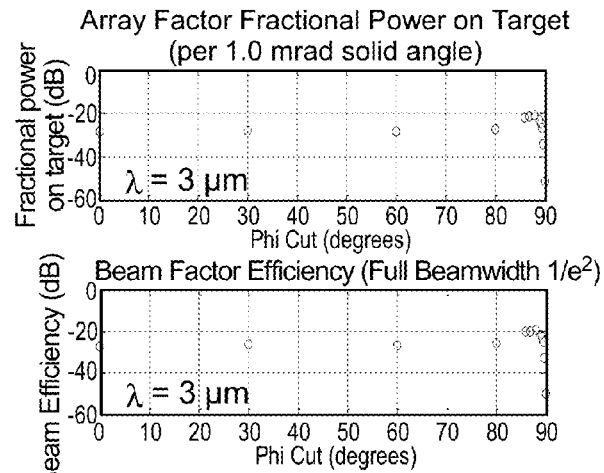
FIGS. 25A, 25B, and 25C illustrate the fractional power on target and beam efficiency for different angles of steering for the phased arrays of FIGS. 24B, 24C and 24E.
Figure 25B:
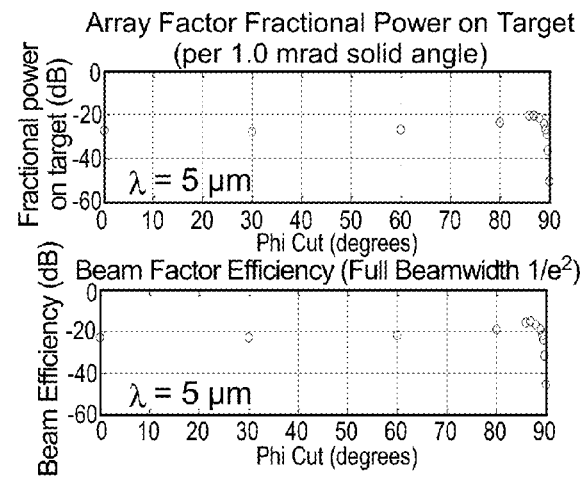
Figure 25C:
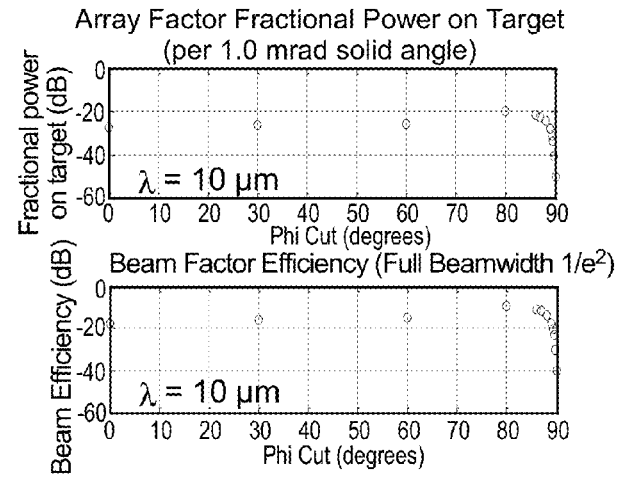

FIGS. 25A, 25B, and 25D illustrate the fractional power on target and beam efficiency for different angles of steering for the phased arrays of FIGS. 24B, 24C and 24E, and show that as the wavelength of the emitted light becomes shorter, the beam efficiency is reduced in proportion to the square of the change in wavelength, because the beam becomes narrower. However, the fractional power on target, which considers only a 1 mrad wide solid angle at the peak of the main beam, experiences only a small change with wavelength.

Figure 26A:
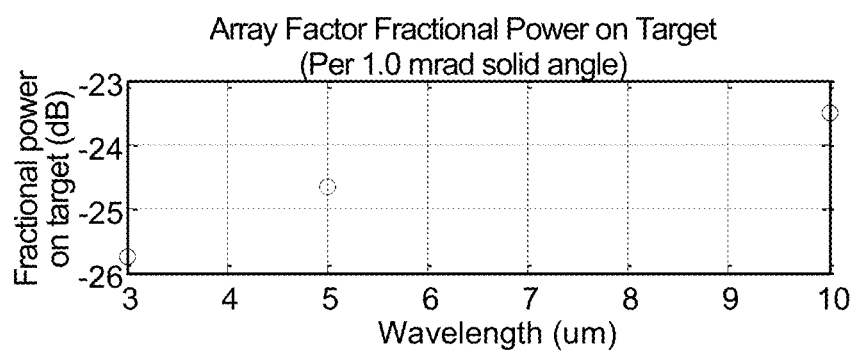
FIGS. 26A and 26B summarize the fractional power on target and beam efficiency per number of rows for the phased arrays of FIGS. 24B, 24C and 24E.
Figure 26B:
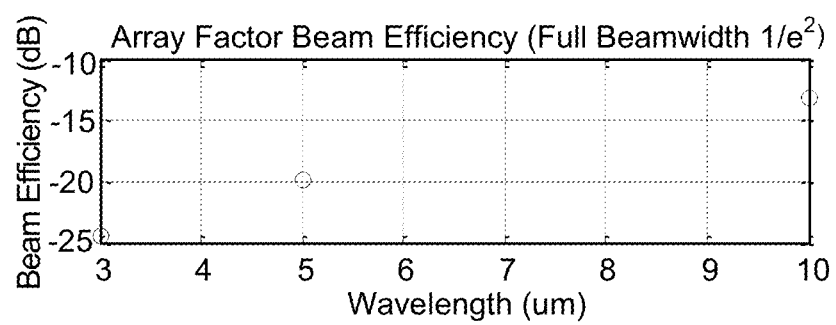

FIGS. 26A and 26B summarize the fractional power on target and beam efficiency per number of rows for the phased arrays of FIGS. 24B, 24C and 24E.

In conclusion, a beam former or phased array according to the present disclosure has the advantages of compact size, beam-pattern versatility and multi-beam, multi-wavelength capability. For a beam former that has 50,000 array elements, the size of a final beam former unit, together with its heat-removing cold plates, can be as small as 3×2×5 cm$^3$. According to embodiments of the present disclosure, each multi-band element can have 3 separate controls for determining the phase of 3 wavelengths and 3 other separate controls for determining the amplitude of 3 wavelengths. A beam former having 300,000 input settings can be controlled readily by a CMOS controller integrated to the beam former unit using focal-plane imager array solder-bump bonding technologies, which can accommodate over 1 million electrical connections. A beam former according to embodiments of the present invention can be manufactured as described in co-pending U.S. patent Ser. No. 14/290,979, filed on May 29, 2014 and entitled: "MULTI-WAVELENGTH BAND OPTICAL PHASE AND AMPLITUDE CONTROLLER" and in co-pending U.S. patent Ser. No. 14/290,986, filed on May 29, 2014 and entitled: "MULTI-SLICE TWO-DIMENSIONAL BEAM FORMER ASSEMBLY".

According to embodiments of the present disclosure, the beam former could cycle between alternately pointing a beam at a first object and then redirecting the beam to point at a second object within a transient response time of less than 0.5 msec for thermo-optic control and less than 0.01 msec for electro-optic control, with relatively low overhead for each redirection of the beam. However, given the beam former's two-mode couplers that enable it to vary the output amplitude for each emitter by redistributing the input light among several emitters with low loss, it also can efficiently form two simultaneous beams and direct them upon the two targets, dividing the output power among those beams.

When the pseudo-random spacing array is very sparse, with the average spacing between emitters much larger than a wavelength of the light emitted, the fractional power on target and the beam efficiency are correspondingly low. In those cases, much of the input laser power supplied and transmitted through the optical beam former module goes into the sidelobe pattern rather than into the main output beams. A pseudo-random spacing according to the present disclosure is effective in removing the grating lobes, and does not increase the relative amount of power in the main beams compared to the amount of power in the sidelobe pattern. For an array of multi-band phase shifters and emitters, the array is more sparse and thus the beam former is less efficient for the shorter wavelength light.

It should be understood that the two-dimensional phased array beam former disclosed herein can be adapted for operation at different ranges of electromagnetic wavelength and frequency. These wavelengths range from below 0.5 µm to 10 µm and even to 100 µm and larger. The description above would then have to be adapted to relate to structures adapted to having the same effect on waves having wavelengths of 0.5 µm to 10 µm or even to 100 µm and larger rather than on lights as described in the exemplary embodiments detailed above.

Further, the present disclosure was made in relation with a phased array that comprises emitter/receiver elements arranged on an array formed of stacked rows, wherein the heights of the rows vary according to a pseudo-random pattern, but the present disclosure also relates to a phased array as described above but wherein each row has a same height, for example the height of a substrate in which the rows are manufactured. For such embodiments, the figures of the drawings are to be considered as not to scale and relating to arrays having rows of fixed height.

Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "comprising the step(s) of . . . ."

What is claimed is:

1. A phased array that comprises:
   a predetermined number of emitter/receiver elements; said emitter/receiver elements being arranged on an array formed of stacked slices, wherein:
   the emitter/receiver elements in each slice of the array have pseudo-random spacing; the spacing between the emitter/receiver elements in each slice of the array resulting from a first pseudo-random pattern generation and different slices of the stack of slices having different patterns for the pseudo-random spacing of their emitter/receiver elements; and
   the slices of the stack have individually a pseudo-random thickness resulting from a second pseudo random pattern generation.

2. The phased array of claim 1, wherein the thickness of each stack is comprised within a first predetermined range.

3. The phased array of claim 2, wherein:
   the emitter/receiver elements of each slice are formed on a side edge of a substrate; said array being formed by stacking together the substrates.

4. The phased array of claim 1, wherein:
   the distance between two consecutive emitter/receiver elements in each slice is comprised within a second predetermined range.

5. The phased array of claim 1, wherein the number of emitter/receiver elements in each slice of the array is more than two times greater than the number of rows of the array.

6. The phased array of claim 1, wherein the density of the emitter/receiver elements differs over different portions of the array.

7. The phased array of claim 6, wherein the array has a center and has edges, and wherein the density of the emitter/receiver elements is larger near the center of the array and smaller near the edges of the array.

8. The phased array of claim 1, wherein the emitter/receiver elements are optical emitter/receiver elements.

9. The phased array of claim 8, wherein the emitter/receiver elements are adapted to emitting and/or receiving light having at least first and second wavelengths.

10. The phased array of claim 9, wherein each emitter/receiver elements comprises a single aperture adapted to emitting and/or receiving the first and second wavelengths.

11. The phased array of claim 10, wherein each emitter/receiver element comprises a lens coupled to said single aperture.

12. The phased array of claim 10, wherein said single aperture of each emitter/receiver elements has first and second beamwidths for respectively the first and second wavelengths.

13. The phased array of claim 12, wherein said lens is adapted to affect differently the beamwidths of the first and second wavelengths and wherein said single aperture of each emitter/receiver elements, coupled to said lens, has similar beamwidths for the first and second wavelengths.

14. The phased array of claim 12, wherein the first wavelength is shorter than the second wavelength; and wherein said single aperture of each emitter/receiver elements has a larger beamwidth for the second wavelength than for the first wavelength.

15. The phased array of claim 14, wherein the lens coupled to said single aperture is adapted to increase the divergence of light of the first wavelength emitted from said single aperture.

16. The phased array of claim 10, wherein the lenses coupled to the apertures of each emitter/receiver element are arranged as an array of micro-lenses coupled to the array.

17. The phased array of claim 14, wherein said single aperture of each emitter/receiver elements is coupled to an end of a first waveguide having a first refraction index and dimensioned to confine a mode of the light of first wavelength; wherein a second waveguide, having a second refraction index smaller than the first refraction index is coupled to the first waveguide and tapers toward the aperture from dimensions enabling the second waveguide to confine a mode of the light of second wavelength to a null thickness; the first and second metal waveguides being clad with metal.

18. The phased array of claim 17, wherein the first and second waveguides are coupled to a multi-band phase shifter adapted to controllably modify the phase of each of the light of first and second wavelengths.

19. The phased array of claim 17, wherein the first and second waveguides are coupled to a multi-band amplitude adjuster adapted to controllably modify the amplitude of each of the light of first and second wavelengths.

* * * * *